(12) United States Patent
Shu et al.

(10) Patent No.: US 11,031,389 B2
(45) Date of Patent: Jun. 8, 2021

(54) SEMICONDUCTOR STRUCTURES OVER ACTIVE REGION AND METHODS OF FORMING THE STRUCTURES

(71) Applicant: GLOBALFOUNDRIES U.S. INC., Santa Clara, CA (US)

(72) Inventors: Jiehui Shu, Clifton Park, NY (US); Hui Zang, Guilderland, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/436,925

(22) Filed: Jun. 11, 2019

(65) Prior Publication Data

US 2020/0395356 A1 Dec. 17, 2020

(51) Int. Cl.
| | | |
|---|---|---|
| *H01L 27/06* | (2006.01) | |
| *H01L 27/105* | (2006.01) | |
| *H01L 21/8234* | (2006.01) | |
| *H01L 29/40* | (2006.01) | |
| *H01L 29/423* | (2006.01) | |
| *H01L 29/06* | (2006.01) | |

(52) U.S. Cl.
CPC .. *H01L 27/0688* (2013.01); *H01L 21/823437* (2013.01); *H01L 27/105* (2013.01); *H01L 29/0649* (2013.01); *H01L 29/401* (2013.01); *H01L 29/4236* (2013.01)

(58) Field of Classification Search
CPC ............... H01L 27/0688; H01L 27/105; H01L 21/823437; H01L 29/0649; H01L 29/401; H01L 29/4236
See application file for complete search history.

(56) References Cited

U.S. PATENT DOCUMENTS

| | | | |
|---|---|---|---|
| 9,425,105 B1 * | 8/2016 | Basker | ................. H01L 29/785 |
| 9,508,825 B1 | 11/2016 | Basker et al. | |
| 9,698,101 B2 | 7/2017 | Greene et al. | |
| 10,211,302 B2 * | 2/2019 | Cheng | ............... H01L 21/31053 |
| 2005/0275042 A1 * | 12/2005 | Hwang | ............... H01L 29/4236 |
| | | | 257/401 |
| 2014/0077305 A1 | 3/2014 | Pethe et al. | |

* cited by examiner

*Primary Examiner* — Dale E Page
*Assistant Examiner* — Quovaunda Jefferson
(74) *Attorney, Agent, or Firm* — David Cain

(57) ABSTRACT

The present disclosure generally relates to semiconductor devices and processing. The present disclosure also relates to semiconductor structures disposed over active regions, more particularly, via contact structures disposed over such active regions and to methods of forming such semiconductor structures.

19 Claims, 21 Drawing Sheets

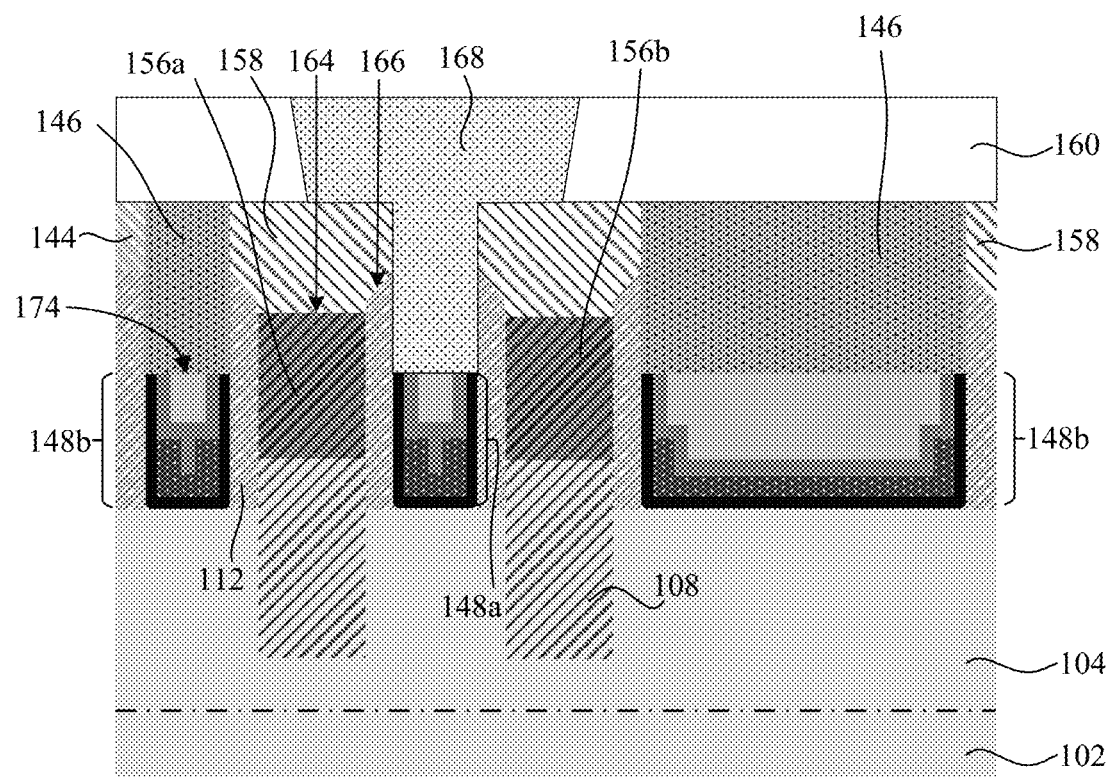
FIG. 14A (i)
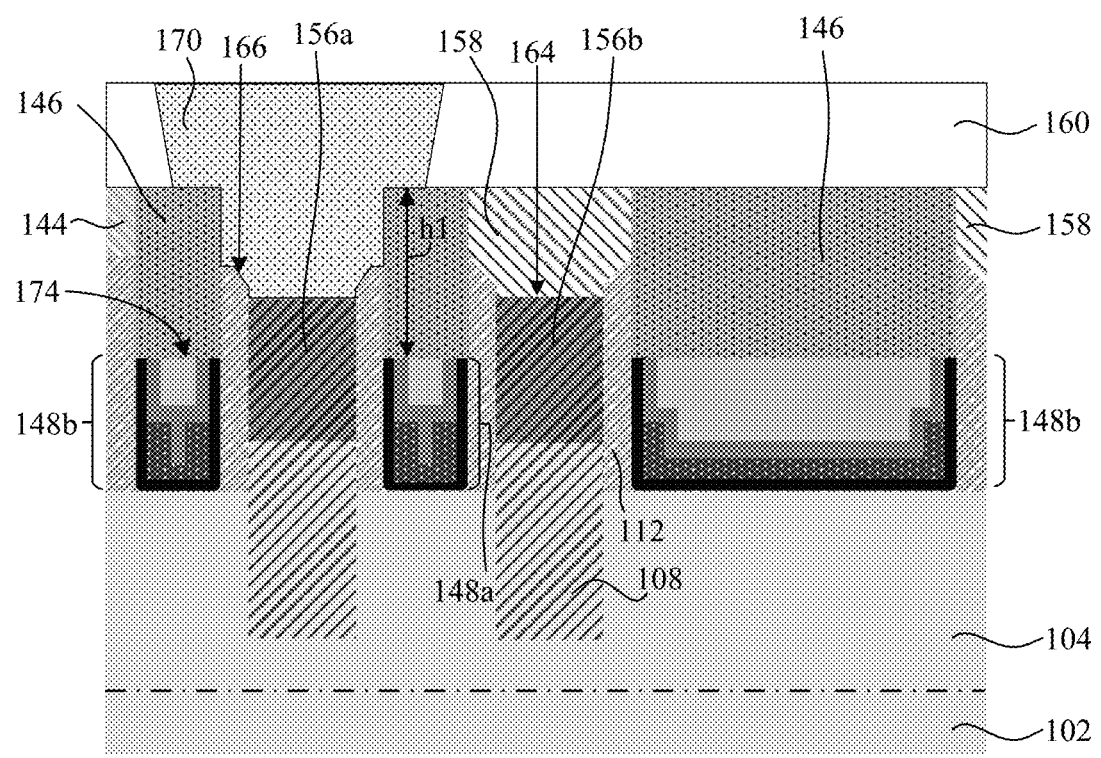
FIG. 14A (ii)

US 11,031,389 B2

SEMICONDUCTOR STRUCTURES OVER ACTIVE REGION AND METHODS OF FORMING THE STRUCTURES

FIELD OF THE INVENTION

The present disclosure generally relates to semiconductor devices and processing. The present disclosure also relates to semiconductor structures disposed over active regions, more particularly, via contact structures disposed over such active regions and to methods of forming such semiconductor structures.

BACKGROUND

The semiconductor industry's drive for higher density, higher performance, lower-cost devices and the implementation of nanometer-scale process nodes have resulted in the development of various integrated circuit devices, in particular, multi-gate transistors (e.g., dual-gate transistors, tri-gate transistors, etc.). Scaling down of multi-gate transistors has been met with challenges. As the dimensions of such devices are being reduced and the density of fabricated devices in a given region is being increased, numerous space and layout constraints have surfaced.

One approach to address those constraints is to configure the gate contact structures above/over the active portions of the gate, instead of being positioned outside the active gate area, so that adjacent devices are spaced closer together. However, limitations to lithographic processes in conventional semiconductor technologies for forming the devices with the aforementioned layout configuration may cause electrical shorts between the gate contact and the source/drain contact.

Therefore, there is a need to provide methods of forming a semiconductor structure that can overcome, or at least ameliorate, one or more of the disadvantages as described above.

SUMMARY

In an aspect of the present disclosure, there is provided a semiconductor device having an active region disposed above a substrate, a plurality of source or drain regions disposed in the active region, a plurality of gate stacks having a first and second gate stacks, where each gate stack is disposed in between the source or drain regions, a plurality of trench contact structures having a first and second trench contact structures, where each trench contact structure is disposed on a corresponding source or drain region, gate spacers with top surfaces, where the gate spacers are adjacent to the trench contact structures, a gate cap dielectric layer disposed on the first or the second gate stack, and a trench cap dielectric layer disposed on the first or the second trench contact structure and the top surfaces of the gate spacers.

In another aspect of the present disclosure, there is provided a semiconductor device having an active region and an insulating layer disposed above a substrate, a plurality of source or drain regions disposed in the active region, a plurality of gate stacks having a first and second gate stacks, where gate stack is disposed in between the source or drain regions, a plurality of trench contact structures having a first and second trench contact structures, where each trench contact structure is disposed on a corresponding source or drain region, gate spacers with top surfaces, where the gate spacers are adjacent to the trench contact structures, a gate cut region having a plurality of gate isolation structures disposed on the insulating layer, where the first trench contact structure is disposed in between the gate isolation structures, a gate cap dielectric layer disposed on the first or the second gate stack, a trench cap dielectric layer disposed on the first or the second trench contact structure and the top surfaces of the gate spacers, and a dielectric fill layer disposed on the gate isolation structures and adjacent to the trench cap dielectric layer.

In yet another aspect of the present disclosure, there is provided a method of forming structures in a semiconductor device by providing on a substrate, active regions having a plurality of source or drain regions formed therein and isolation regions having a plurality of dielectric isolation structures with adjacent gate spacers and a gate cut region having a plurality of gate isolation structures and a plurality of gate isolation material layers, wherein the dielectric isolation structures have a portion formed on the plurality of source or drain regions and a portion formed in between the gate isolation structures with the gate isolation material layer from the gate cut region thereabove, forming gate cavities between the source or drain regions, forming gate stacks in the gate cavities, forming spacer cavities by recessing top surfaces of the gate spacers, forming a dielectric fill layer to fill the spacer cavities, forming trench contact cavities by selectively removing the dielectric fill layer and the dielectric isolation structures, and forming trench contact structures in the trench contact cavities.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Various illustrative embodiments of the present disclosure are described below. The embodiments disclosed herein are exemplary and not intended to be exhaustive or limiting to the present disclosure.

Figure 1:
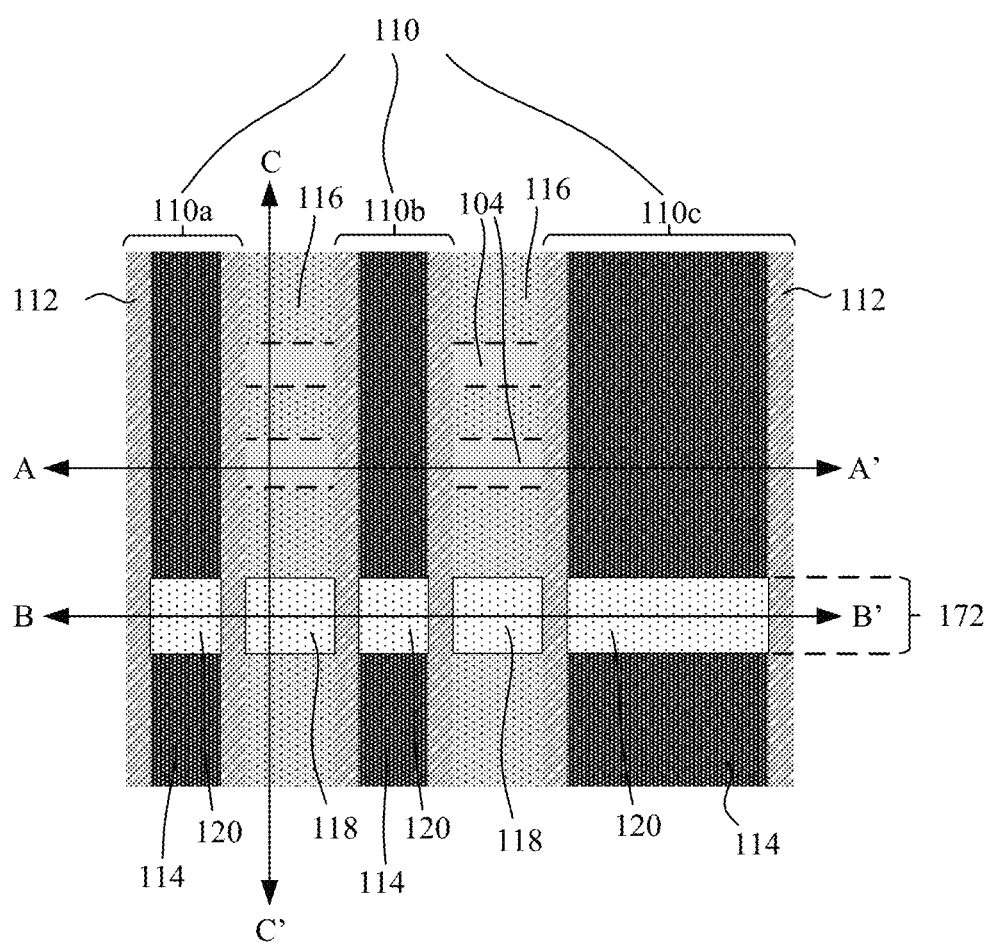
FIG. 1 is a plan view of an exemplary device structure for fabricating a semiconductor device in accordance with embodiments of the present disclosure. In the following figures, line A-A' designates a cross section location for figures suffixed with "A", line B-B' designates a cross section location for figures suffixed with "B", and line C-C' designates a cross section location for figures suffixed with "C".

Referring to FIG. 1, a plan view of an exemplary device structure is shown. The device structure includes one set of device elements targeted for use with embodiments of the present disclosure, but it is understood that embodiments of the present disclosure can be implemented on different designs without any change to the techniques discussed herein. The device structure may be formed by conventional semiconductor fabrication processes. The device structure includes a substrate (not shown in FIG. 1), active regions 104 and insulating layers (not shown in FIG. 1) formed on the substrate, and a plurality of gates 110 disposed above and extending laterally across the active region 104.

The plurality of gates 110 may include short channel gates 110a and 110b and long channel gate 110c. The gates 110a, 110b, and 110c are flanked on their sides by adjacent gate spacers 112. As shown in FIG. 1, each gate 110a, 110b, and 110c has dummy gate structures 114 separated by a gate isolation structure 120. In some embodiments, the dummy gate structures 114 include amorphous silicon.

The device structure also includes isolation regions having a plurality of dielectric isolation structures 116 with adjacent gate spacers 112 and a "gate cut" region 172.

Each dielectric isolation structure 116 extends adjacently along and separates the gates 110. The dielectric isolation structures 116 may include an oxide-containing dielectric compound or silicon dioxide ($SiO_2$). As shown in FIG. 1, a dotted rectangular box outlining the active regions 104 indicates that active regions 104 are located below the dielectric isolation structures 116.

In embodiments of the present disclosure, the plurality of gate isolation structures 120 is located in the "gate cut" region 172 of the device structure, as illustrated in FIG. 1. A gate isolation material layer 118 is disposed in a portion of each dielectric isolation structure 116 intersecting the gate cut region 172, as shown in FIG. 1. In the accompanying drawings, figures suffixed with "B" illustrate cross-sectional views along the gate cut region 172 of the device structure, as indicated by the section line B-B'.

The gate isolation structures 120 may be formed using conventional "gate cut" processes, and may be formed to interrupt the continuity of the gates 110a, 110b, and 110c and divide the dummy gate structures 114 into segments. Although not shown in the accompanying drawings, exemplary "gate cut" processes may include forming a trench opening in each gate 110a, 110b, and 110c to divide the dummy gate material in each gate 110a, 110b, and 110c, followed by filling the trench opening with a dielectric material. The formation of the trench openings in the gates may also recess portions of the dielectric isolation structure 116 that are within the gate cut region 172. The filling of the trench opening with the dielectric material also forms the gate isolation material layers 118 on the recessed portions of dielectric isolation structure 116. As a result, the gate isolation structure 120 and the gate isolation material layer 118 can be formed of the same dielectric material, such as a nitride-containing dielectric compound or silicon nitride.

The gate spacers 112 may include a low-K dielectric material. The term "low-K" as used herein refers to a material having a dielectric constant (i.e., K-value) that is lower than 7. Examples of low-K dielectric materials may include, but not limited to, silicon dioxide ($SiO_2$), silicon oxide materials enriched or doped with atomic elements selected from the group consisting of carbon, boron, hydrogen and nitrogen (e.g., SiOCN, SiBCN), silicon oxynitride (SiON), SiGe oxide, germanium oxide, silicon oxycarbide, SiCOH dielectrics, or any combination of these materials. The gate spacers 112 may have a dielectric constant in the range of about 1 to about 3. In an embodiment, the gate spacers 112 preferably include SiOCN.

Figure 2A:
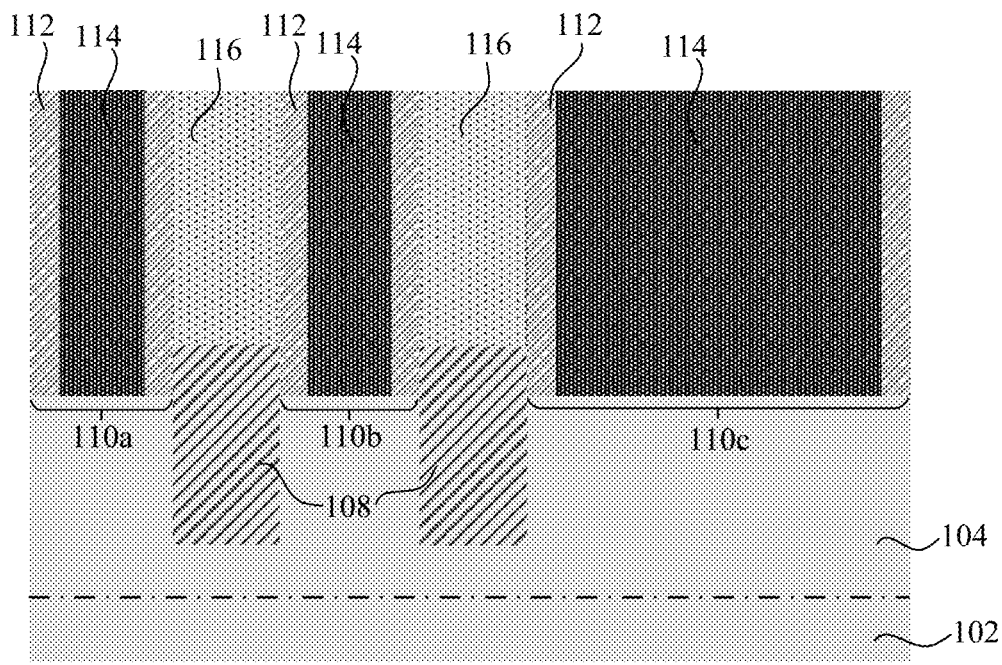
FIGS. 2A, 2B, and 2C are cross-sectional views of the device structure of FIG. 1, in accordance with embodiments of the present disclosure.

FIG. 2A depicts the cross-sectional view of the structure shown in FIG. 1 along the section line A-A'. Referring to FIG. 2A, a plurality of source or drain regions 108 is formed in the active region 104. The source or drain regions 108 may be formed by epitaxial growth of a semiconductor material, as described herein, with in-situ doping. The source or drain regions may be doped with N-type dopants (e.g., arsenic, phosphorus, or antimony) or P-type dopants (e.g., boron, aluminum, or gallium). Each one of the source or drain region 108 is formed between the gates 110a, 110b, and 110c.

As shown in FIG. 2A, each of the plurality of dielectric isolation structures 116 has a portion disposed on each one of the plurality of source or drain regions 108. Each dummy gate structure 114 is disposed between each source or drain regions 108 and gate spacers 112 are disposed on sidewalls of each dummy gate structure 114.

The term "epitaxial growth" as used herein refers to the growth of a semiconductor material on a deposition surface of a same or different semiconductor material, in which the grown semiconductor material will have the same crystalline characteristics as the deposition surface of the semiconductor material.

The active region 104 is disposed on the substrate 102. The active region 104 may be a fin and may be made of any suitable semiconductor material, such as silicon, germanium, or silicon germanium. The substrate 102 may be made of any suitable semiconductor material, such as silicon (Si), germanium (Ge), silicon germanium (SiGe), silicon/carbon, other II-VI or III-V semiconductor compounds and the like. The substrate 102 may also include an organic semiconductor or a layered semiconductor, such as Si/SiGe, a silicon-on-insulator or a SiGe-on-insulator.

Figure 2B:
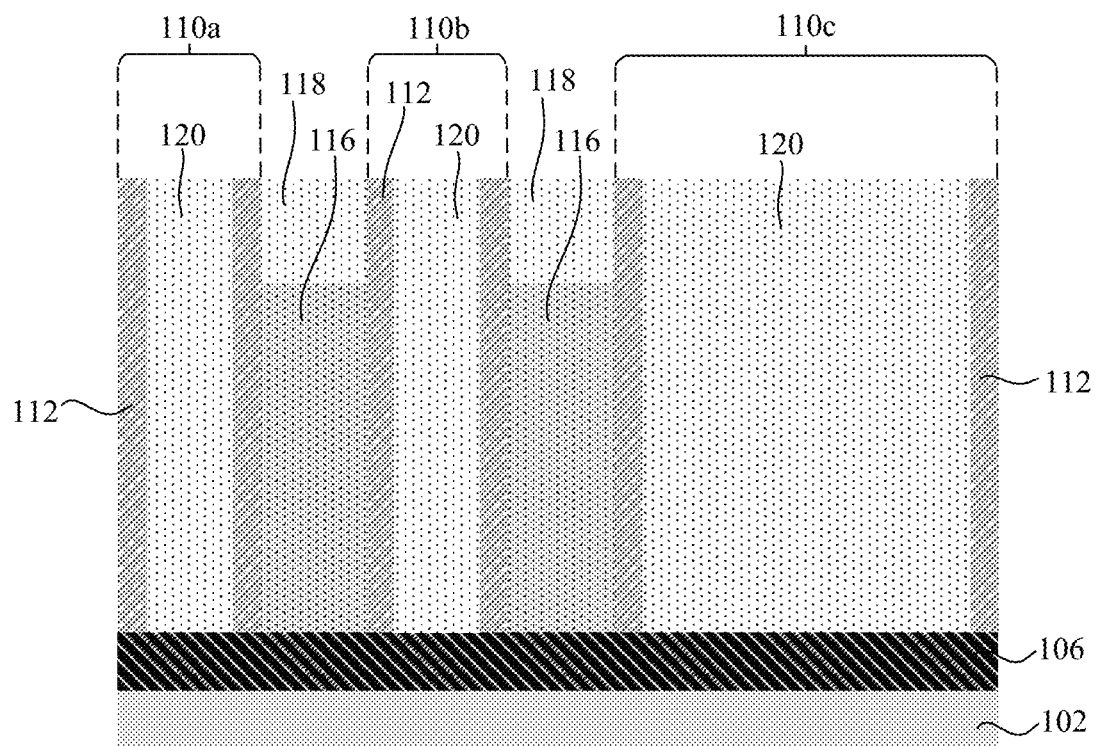

FIG. 2B depicts the cross-sectional view of the structure shown in FIG. 1 along the section line B-B'. Referring to FIG. 2B, the insulating layer 106 is disposed on the substrate 102. The insulating layer 106 may be a shallow trench isolation layer and may include any dielectric material, such as silicon dioxide or silicon nitride.

As shown in FIG. 2B, a plurality of gate isolation structures 120 is disposed on the insulating layer 106 and gate spacers 112 are disposed on sidewalls of each gate isolation structure 120. Each dielectric isolation structure 116 has a portion disposed in between the gate isolation structures 120 within the gate cut region.

Figure 2C:
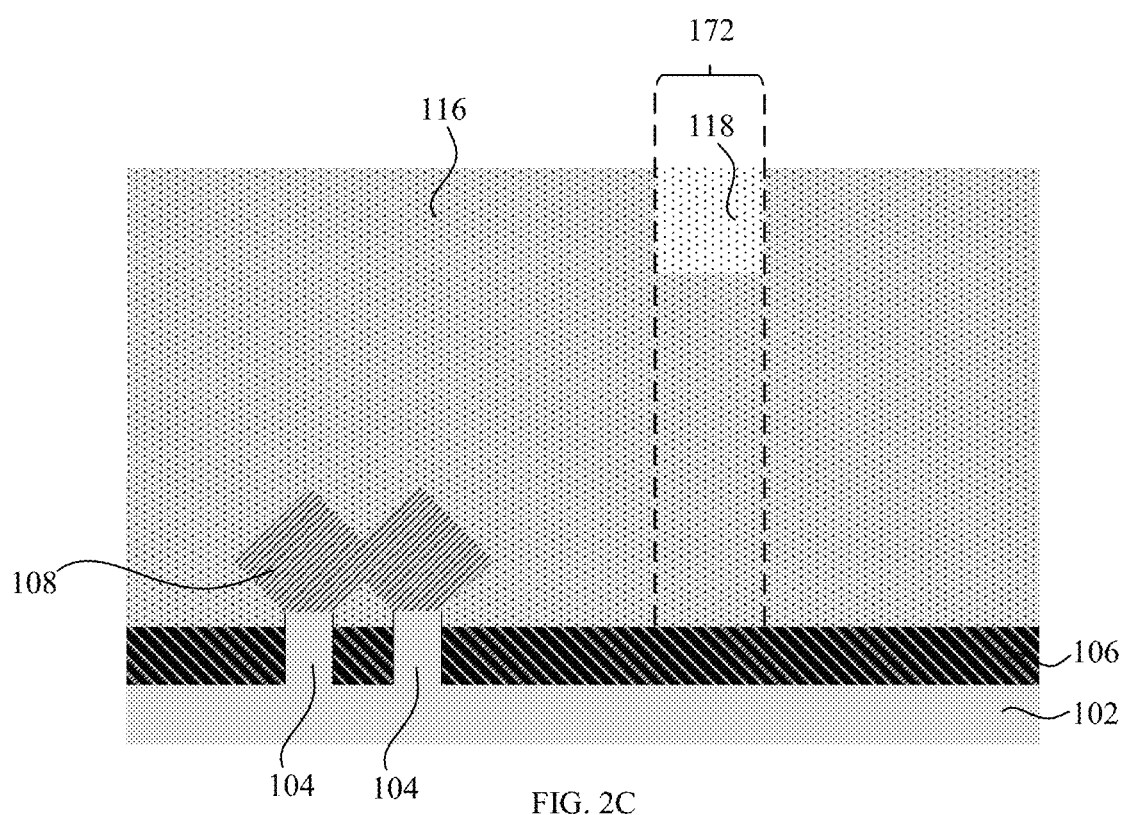

FIG. 2C depicts the cross-sectional view of the structure shown in FIG. 1 along the section line C-C'. Referring to FIG. 2C, the gate isolation material layer 118 is formed above the portion of the dielectric isolation structure 116 within the gate cut region 172.

The formation of the source or drain region 108 in the active region 104 may result in a merged epitaxial structure. For example, the formation of the source or drain region 108 begins by growing smaller structures having a diamond-like shape in the active regions 104. The epitaxial growth of diamond-shaped structures in the lateral direction causes them to merge with adjacent diamond shaped structures, which results in the merged epitaxial structure shown in FIG. 2C. Although not shown in the accompanying drawings, it is within the scope of the present disclosure to control the epitaxial growth of the source or drain regions 108 such that discrete epitaxial structures (i.e., "unmerged" structures) are formed, subject to the conductivity types of the active regions 104 (e.g., N-type or P-type conductivity).

Figure 3A:
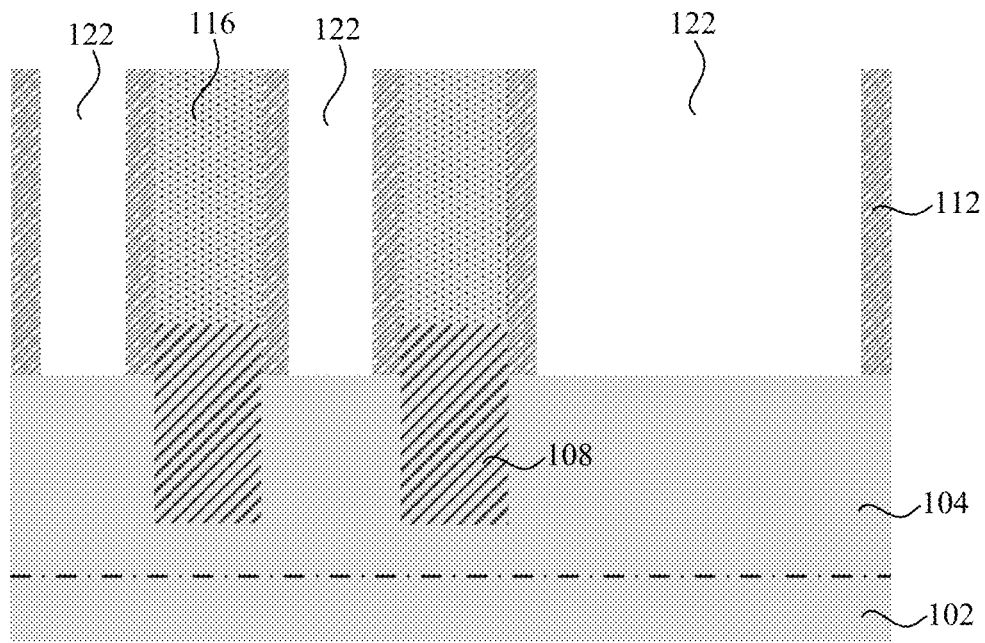
FIGS. 3A and 3B are cross-sectional views of the device structure after formation of gate cavities, in accordance with embodiments of the present disclosure.
Figure 3B:
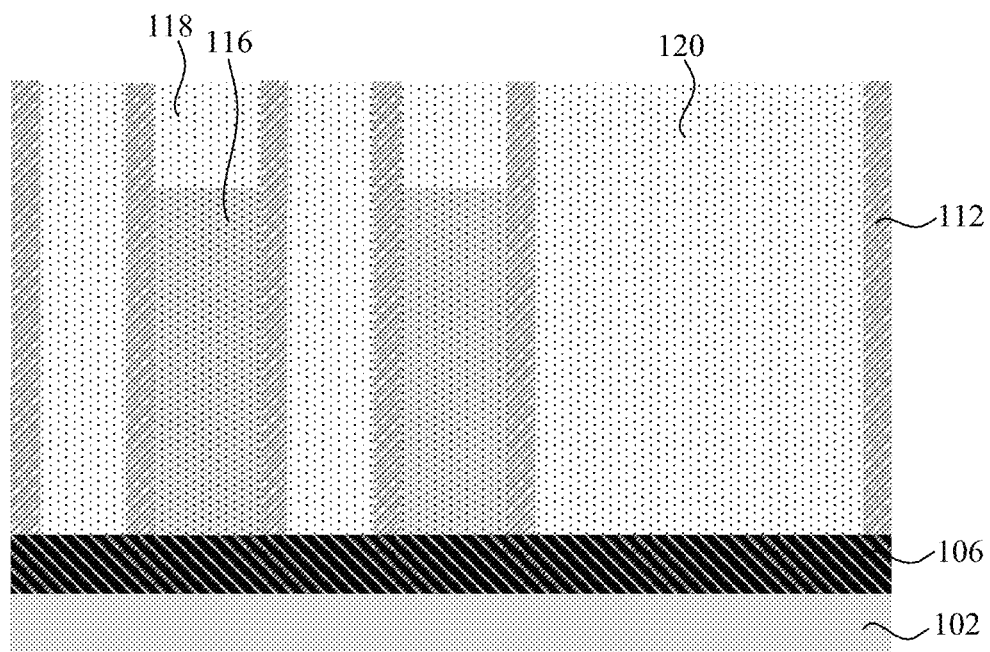

Referring to FIGS. 3A and 3B (FIG. 3A continues from the embodiment shown in FIG. 2A, and FIG. 3B continues from the embodiment shown in FIG. 2B), a plurality of gate cavities 122 are formed by removing the dummy gate structures 114. The view in FIG. 3B is identical to the view in FIG. 2B. The dummy gate structures may be removed by etching techniques employed in conventional replacement metal gate (RMG) processes (e.g., a wet etch).

Figure 4A:
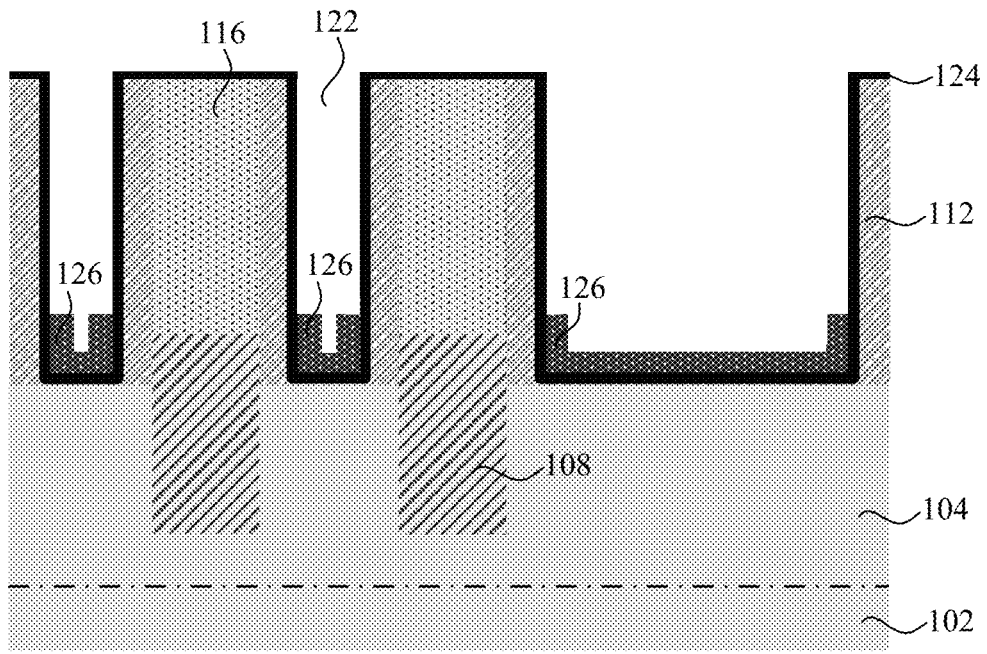
FIGS. 4A and 4B are cross-sectional views of the device structure after formation of a work-function material layer and a gate dielectric layer, in accordance with embodiments of the present disclosure.
Figure 4B:
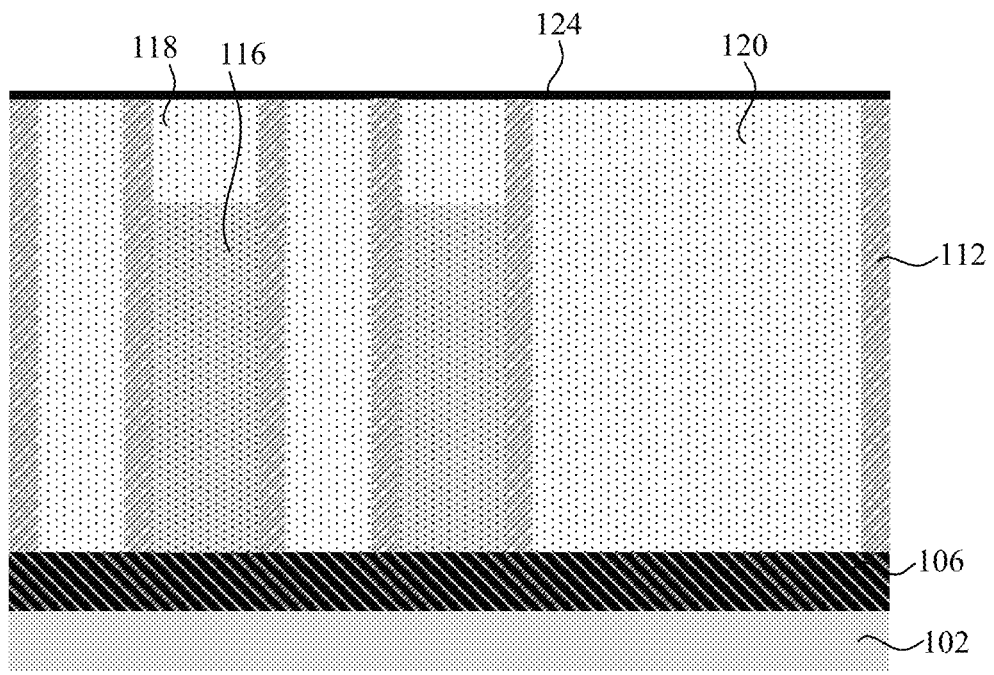

Referring to FIGS. 4A and 4B (FIG. 4A continues from the embodiment shown in FIG. 3A, and FIG. 4B continues from the embodiment shown in FIG. 3B), a gate dielectric layer 124 and a work-function material (WFM) layer 126 are formed in each of the gate cavities 122.

As shown in FIG. 4A, the gate dielectric layer 124 is conformally deposited in the gate cavities 122 and extending over the gate spacers 112 and the dielectric isolation structures 116. The WFM layer 126 is conformally deposited on the gate dielectric layer 124. As shown in FIG. 4B, the deposited gate dielectric layer 124 overlies the gate spacers 112, the gate isolation structures 120 and the gate isolation material layers 118.

The gate dielectric layer 124 and the WFM layer 126 may be formed by conventional deposition processes, such as chemical vapor deposition (CVD), physical vapor deposition (PVD), molecular beam deposition (MBD), pulsed laser deposition (PLD), liquid source misted chemical deposition (LSMCD), atomic layer deposition (ALD), etc. However, a highly conformal deposition process is preferred for depositing the gate dielectric layer 124 and the WFM layer 126; for example, an ALD process or a highly-controlled CVD process.

A conventional chamfering process is additionally performed such that the WFM layer 126 is recessed within the lower portion of the gate cavities 122 (i.e., portions of the WFM layer 126 overlying the dielectric isolation structures 116 are removed). For example, the chamfering process may include depositing a mask layer (not shown for illustrative convenience) over the WFM layer 126 and filling the gate cavities 122. The deposited mask layer may be treated with conventional planarization or etching techniques to expose portions of the WFM layer 126 overlying the dielectric isolation structures 116. The exposed portions of the WFM layer 126 are removed by wet etching, and the mask layer is removed by ashing and wet etching thereafter. Examples of the mask layer used in the chamfering process may include a spin-on hard mask or an organic planarization layer.

The gate dielectric layer 124 may include a high-K dielectric material. The high-K dielectric material may include, but not limited to, hafnium oxide ($HPO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum aluminum oxide ($LaAlO_3$), yttrium oxide ($Y_2O_3$), hafnium oxynitride ($HfO_xN_y$), zirconium oxynitride ($ZrO_xN_y$), lanthanum oxynitride ($La_2O_xN_y$), aluminum oxynitride ($Al_2O_xN_y$), titanium oxynitride ($TiO_xN_y$), strontium titanium oxynitride ($SrTiO_xN_y$), lanthanum aluminum oxynitride ($LaAlO_xN_y$), yttrium oxynitride ($Y_2O_xN_y$), a silicate thereof, and an alloy thereof. Each value of x is independently from 0.5 to 3 and each value of y is independently from 0 to 2. In an embodiment, the gate dielectric layer 124 preferably includes $HfO_2$. The gate dielectric layer 124 may have a thickness in the range of about 0.9 nm to about 6 nm.

The WFM layer 126 may include any metallic compound or a composition of metallic compounds capable of modifying the work function property of a gate electrode. Examples of metallic compounds may include, but not limited to, Hf, Ti, Zr, Cd, La, Tl, Yb, Al, Ce, Eu, Li, Pb, Tb, Bi, In, Lu, Nb, Sm, V, Zr, Ga, Mg, Gd, Y, TiAl, TaN, Pt, Rh, Ir, Ru, Cu, Os, Be, Co, Pd, Te, Cr, Ni, a stack thereof, a conductive oxide thereof, a conductive nitride thereof, an alloy thereof, and a combination thereof. The WFM layer 126 may have a thickness in the range of about 0.5 nm to about 5 nm.

Figure 5A:
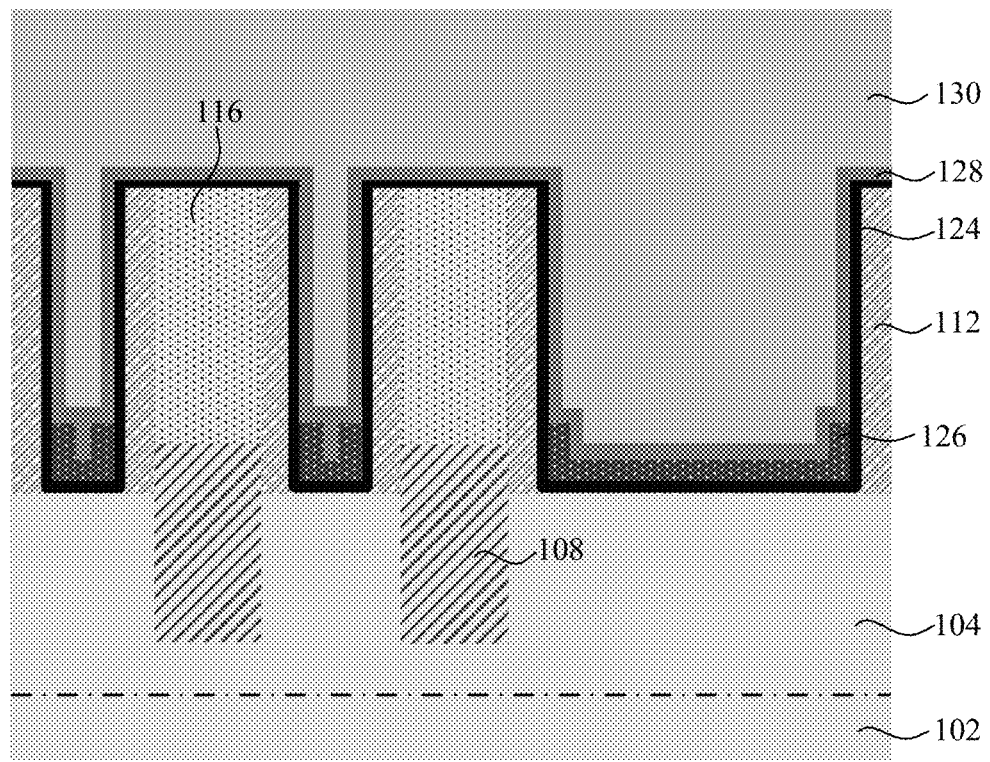
FIGS. 5A and 5B are cross-sectional views of the device structure after formation of a planarization stop liner and a gate electrode material layer, in accordance with embodiments of the present disclosure.
Figure 5B:
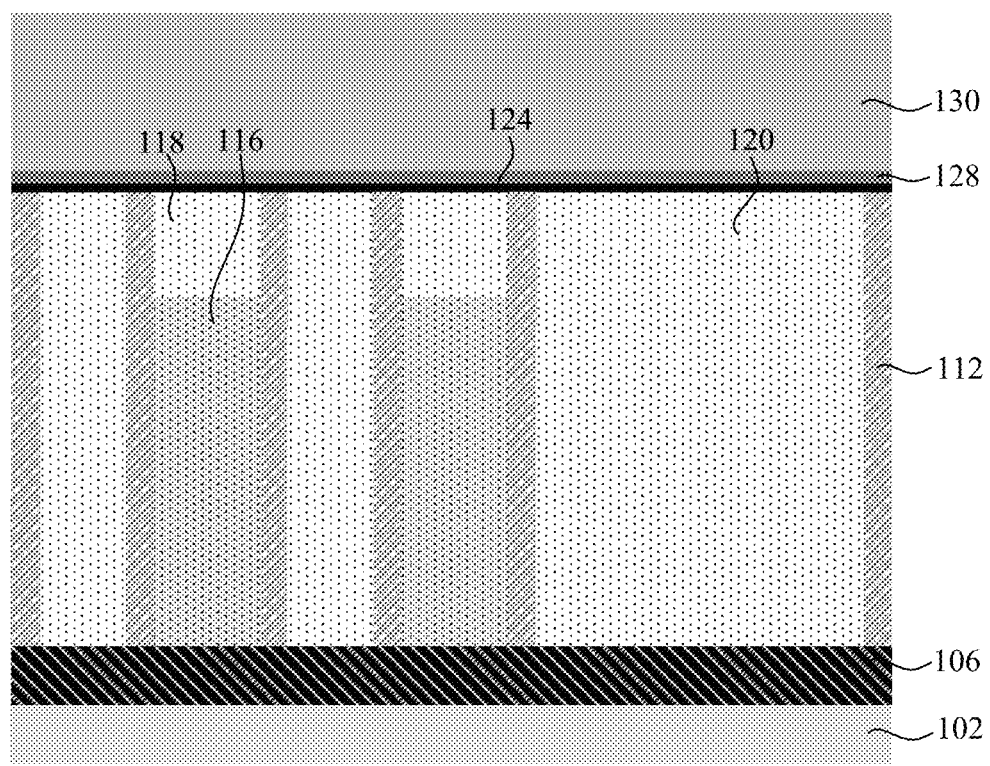

Referring to FIGS. 5A and 5B (FIG. 5A continues from the embodiment shown in FIG. 4A, and FIG. 5B continues from the embodiment shown in FIG. 4B), a planarization stop liner 128 and a gate electrode material layer 130 are formed in the gate cavities.

As shown in FIG. 5A, the planarization stop liner 128 is conformally deposited on the gate dielectric layer 124, the WFM layer 126. The gate electrode material layer 130 is formed on the planarization stop liner 128 and fills the gate cavities. As shown in FIG. 5B, the planarization stop liner 128 is formed on the gate dielectric layer 124, while the gate electrode material layer 130 is formed on the planarization stop liner 128.

The planarization stop liner 128 may be formed using conventional deposition processes described herein, however, a highly conformal deposition process, such as an ALD process or a highly-controlled CVD process, is preferred to deposit the planarization stop liner 128. In some embodiments, the planarization stop liner 128 is a titanium nitride (TiN) liner or a tantalum nitride (TaN) liner.

The gate electrode material layer 130 may be formed by conventional deposition processes, such as ALD, CVD, PVD or sputtering. The gate electrode material layer 130 may include an electrically conductive material. Examples of electrically conductive materials for the gate electrode material layer 130 may include, but not limited to, tungsten (W), cobalt (Co), nickel (Ni), copper (Cu), aluminum (Al), and polysilicon (Si). In an embodiment, the gate electrode material layer 130 preferably includes tungsten.

Figure 6A:
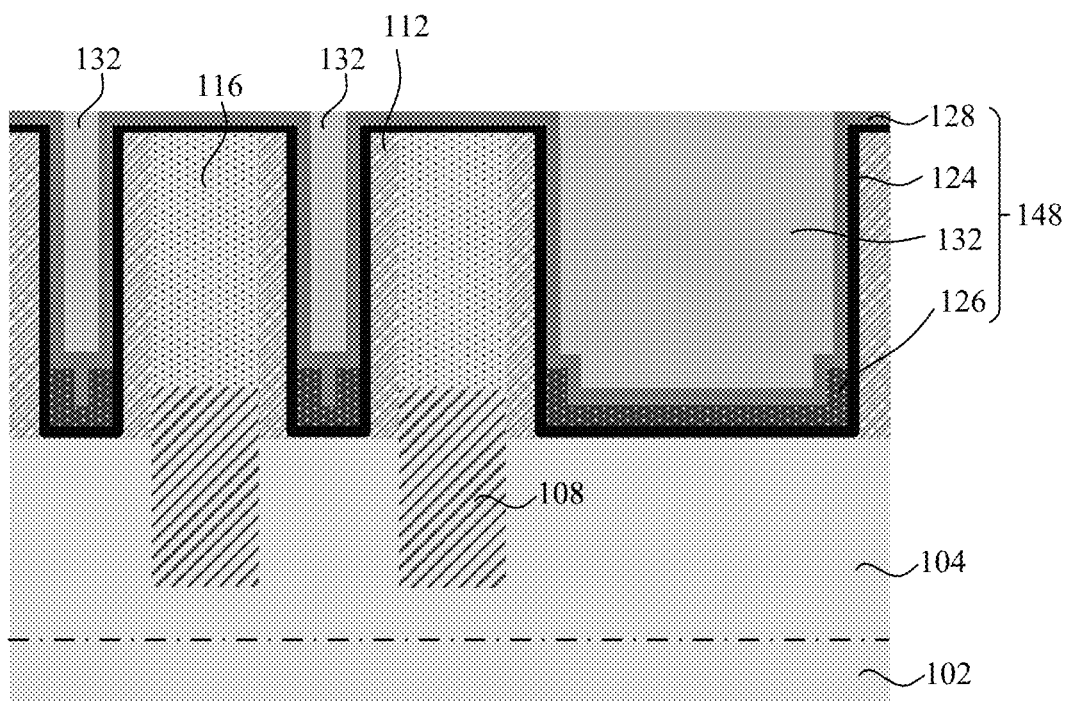
FIGS. 6A and 6B are cross-sectional views of the device structure after planarization of the gate electrode material layer, in accordance with embodiments of the present disclosure.
Figure 6B:
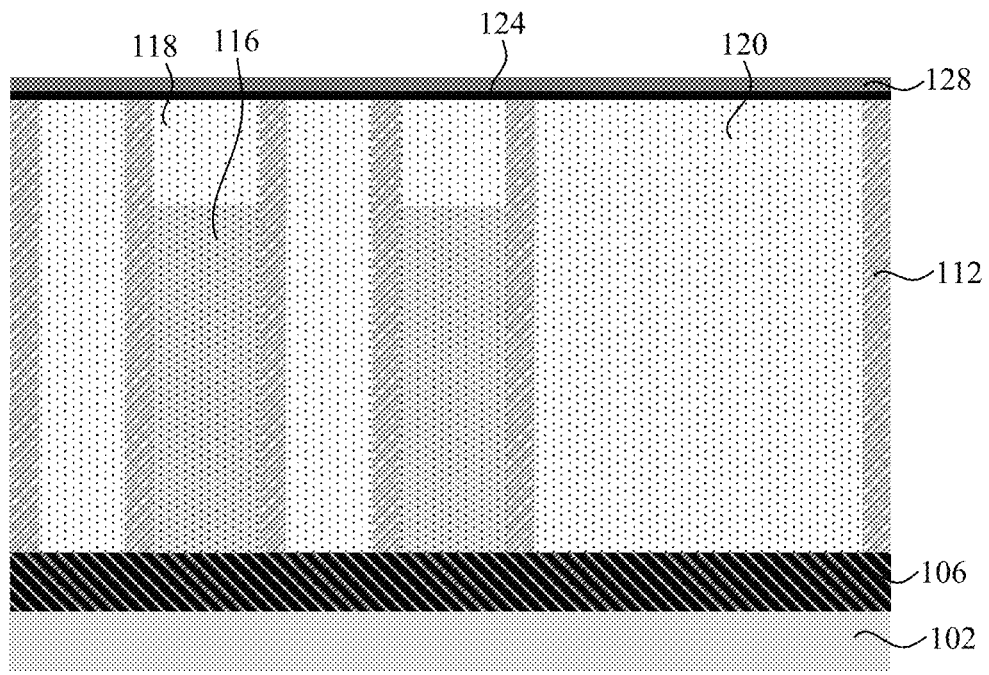

Referring to FIGS. 6A and 6B (FIG. 6A continues from the embodiment shown in FIG. 5A, and FIG. 6B continues from the embodiment shown in FIG. 5B), the gate electrode material layer is planarized to form separate gate electrodes 132. As illustrated in FIG. 6A, the formation of the gate electrode 132, the planarization stop liner 128, the WFM layer 126, and the gate dielectric layer 124 constitutes a gate stack 148 in each gate.

The planarization process may use conventional planarization techniques, such as chemical-mechanical polishing (CMP), and/or plasma ashing, and is stopped by the planarization stop liner 128. Accordingly, the planarization process exposes the planarization stop liner 128, as shown in FIGS. 6A and 6B.

In conventional semiconductor fabrication, the planarization process continues to remove the gate isolation material layer 118 and stops upon reaching the underlying dielectric isolation structures 116 shown in the embodiment of FIG. 6B. Such a process also inadvertently removes an upper portion of the gates, thereby reducing the available gate height for subsequent formation of gate cap dielectric layers (as will be shown in subsequent figures).

In the present disclosure, however, the planarization stop liner 128 advantageously enables the planarization process to be stopped before the recession of the gates occurs and prevents undesirable loss of height of the gates.

Figure 7A:
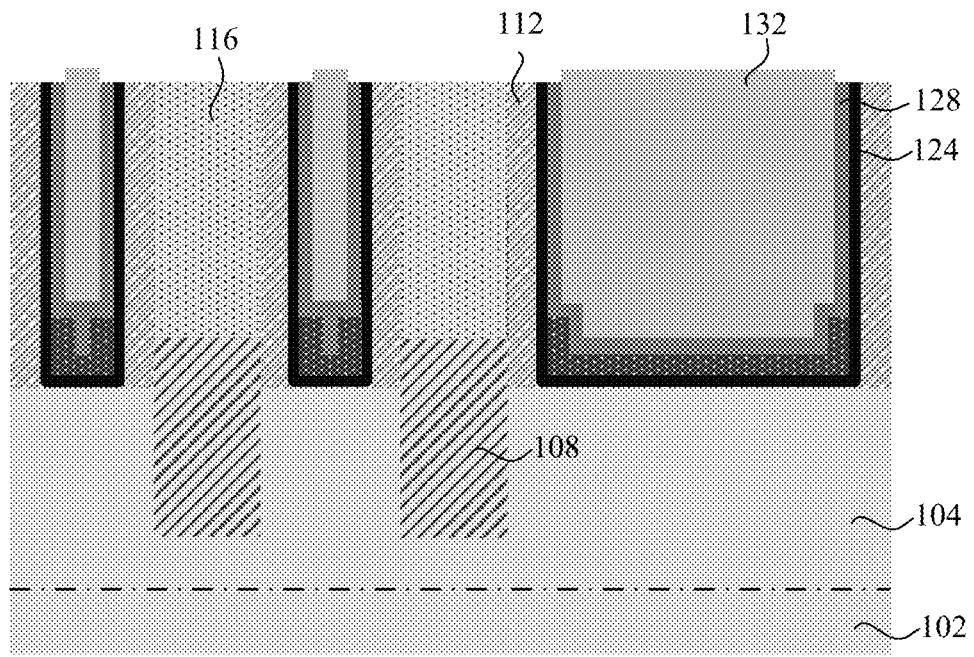
FIGS. 7A and 7B are cross-sectional views of the device structure after selective removal of the planarization stop liner and the gate dielectric layer, in accordance with embodiments of the present disclosure.
Figure 7B:
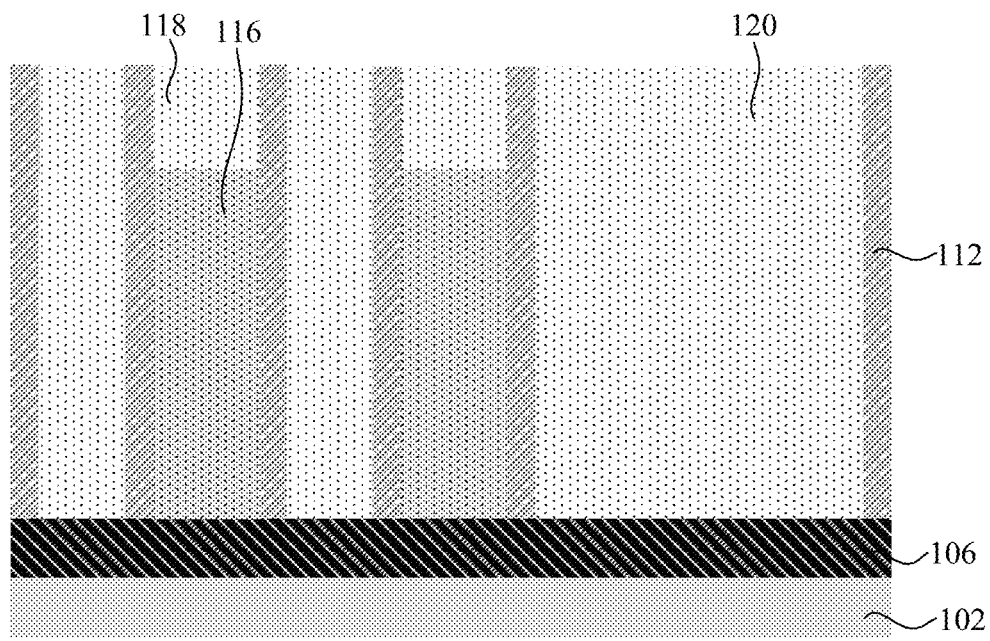

Referring to FIGS. 7A and 7B (FIG. 7A continues from the embodiment shown in FIG. 6A, and FIG. 7B continues from the embodiment shown in FIG. 6B), portions of the planarization stop liner 128 and the gate dielectric layer 124 are removed by selective etching (e.g., isotropic etching using a dry etchant or a wet etchant).

As shown in FIG. 7A, the planarization stop liner 128 and the gate dielectric layer 124 are selectively removed to expose the gate spacers 112 and the adjacent dielectric isolation structures 116. As shown in FIG. 7B, the planarization stop liner 128 and the gate dielectric layer 124 are selectively removed to also expose the gate isolation structures 120, the gate isolation material layer 118 and the gate spacers 112.

Figure 8A:
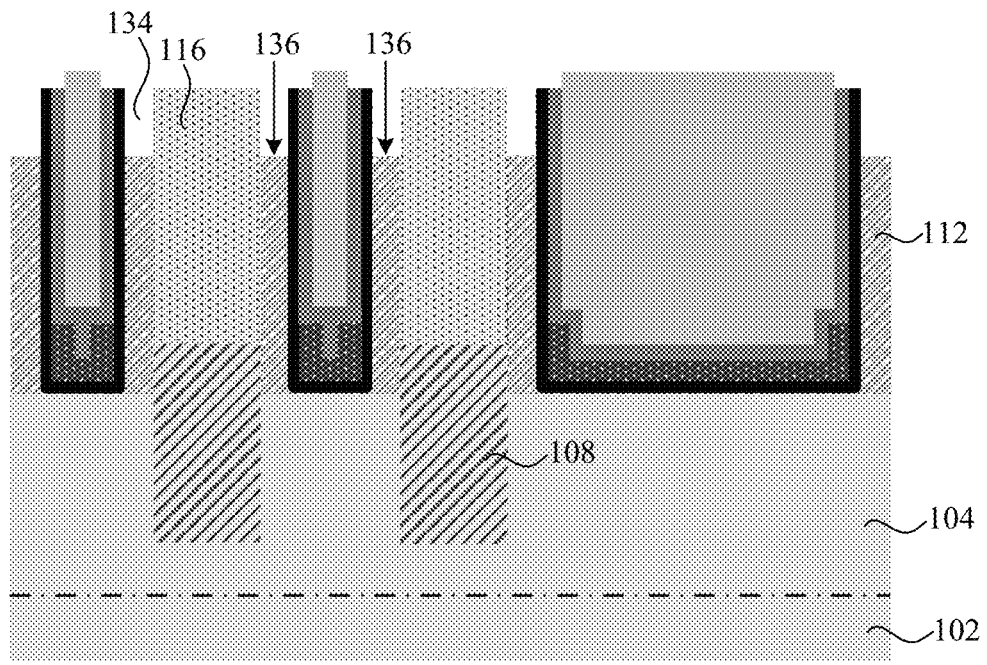
FIGS. 8A, 8B, and 8C are cross-sectional views of the device structure after the formation of spacer cavities, in accordance with embodiments of the present disclosure.

Referring to FIG. 8A (FIG. 8A continues from the embodiment shown in FIG. 7A), spacer cavities 134 are formed by recessing top surfaces 136 of the exposed gate spacers 112. In particular, the spacer cavities 134 may be formed by removing an upper portion of the gate spacers 112 using a selective dry etch process and may be controlled by a predetermined time. In some embodiments, each of the spacer cavities 134 has a depth in the range of about 2 nm to about 10 nm.

Figure 8B:
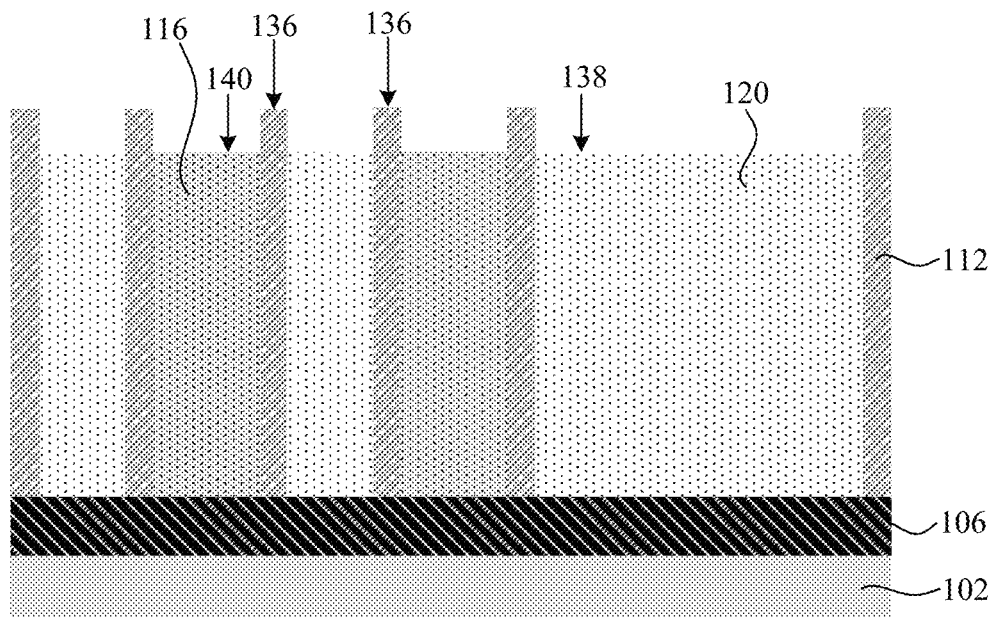

Referring to FIG. 8B (FIG. 8B continues from the embodiment shown in FIG. 7B), the dry etch process to form the spacer cavities 134 simultaneously removes the gate isolation material layer 118 to reveal a top surface 140 of the portion of the dielectric isolation structure 116 within the gate cut region. Additionally, the dry etch process also recesses the adjacent gate isolation structures 120 to form top surfaces 138 that are coplanar with the top surfaces 140 of the dielectric isolation structures 116. The top surfaces 136 of the gate spacers 112 in the embodiment shown in FIG. 8A are level with the top surfaces 136 of the gate spacers 112 shown in FIG. 8B.

Due to the differences in the relative etch rates of the gate spacers 112, the gate isolation structures 120 and the gate isolation material layers, the top surfaces 136 of the gate spacers 112 is higher relative to the top surfaces 140 of the dielectric isolation structures 116 after the dry etch process.

Furthermore, the etch selectivities between the material in the dielectric isolation structure 116, the material in the gate spacers 112, the material in the gate isolation structures 120 and the gate isolation material layers may be engineered to minimize loss of the dielectric isolation structures 116 during the formation of the spacer cavities 134.

Figure 8C:
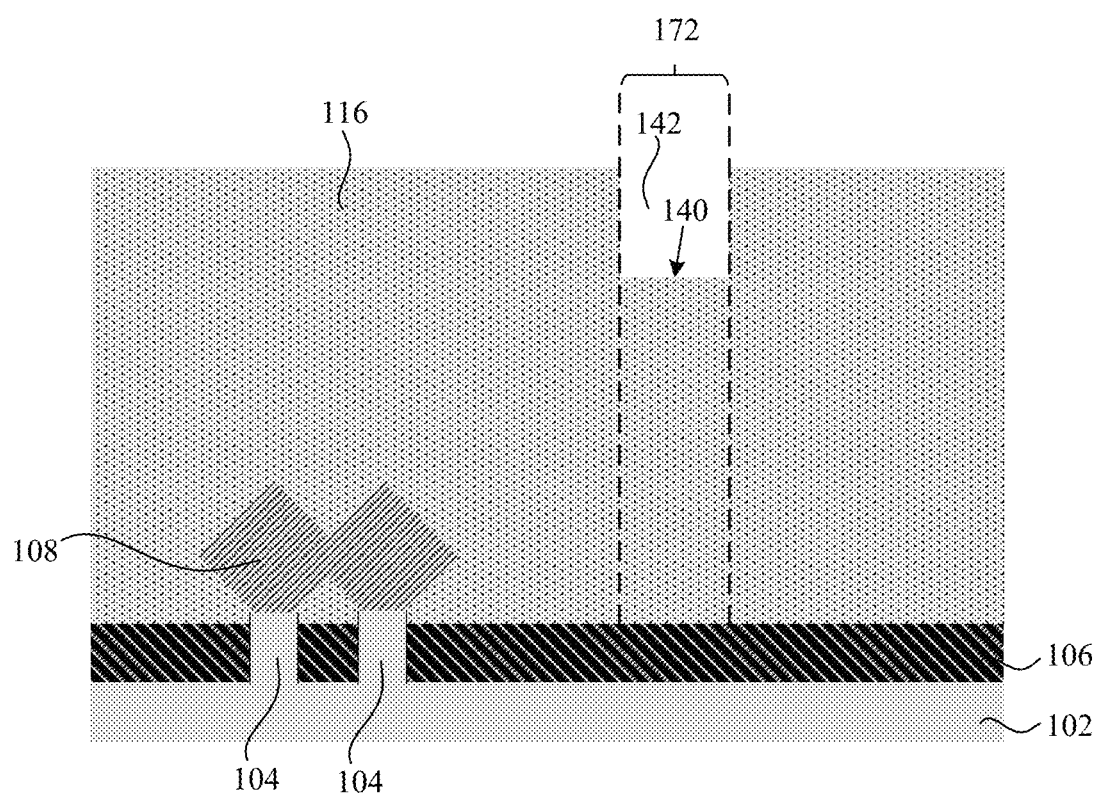

FIG. 8C continues from the embodiment shown in FIG. 2C and illustrates a recess opening 142 formed in the portion of the dielectric isolation structure 116 within the gate cut region 172 after the removal of the gate isolation material layer 118.

Figure 9A:
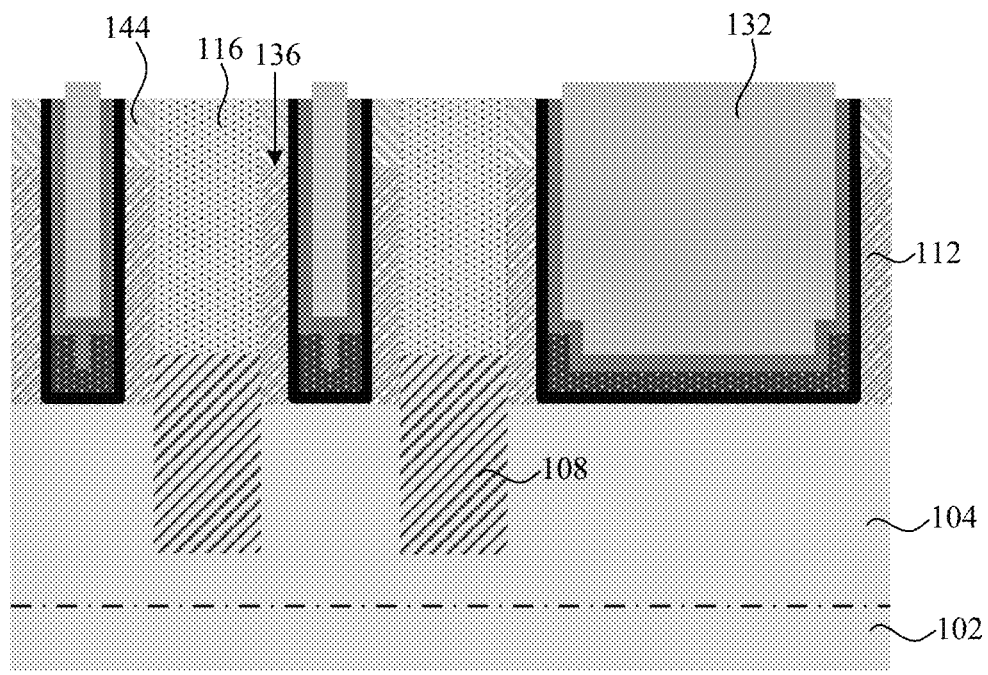
FIGS. 9A, 9B, and 9C are cross-sectional views of the device structure after formation of a dielectric fill layer, in accordance with embodiments of the present disclosure.

Referring to FIG. 9A (FIG. 9A continues from the embodiment shown in FIG. 8A), a dielectric fill layer 144 is formed to fill the spacer cavities. The dielectric fill layer 144 may be deposited over the device structure using conventional deposition processes described herein, e.g., CVD or ALD. The deposition of the dielectric fill layer 144 may include overfilling the spacer cavities with additional planarization (e.g., CMP or selective etching process). As shown in FIG. 9A, the dielectric fill layer 144 is deposited on the top surfaces 136 of the gate spacers 112. In embodiments of the present disclosure, the dielectric fill layer 144 has the same etch selectivity as the dielectric isolation structures 116. The dielectric fill layer 144 may contain the same dielectric material as that of the dielectric isolation structures 116.

Figure 9B:
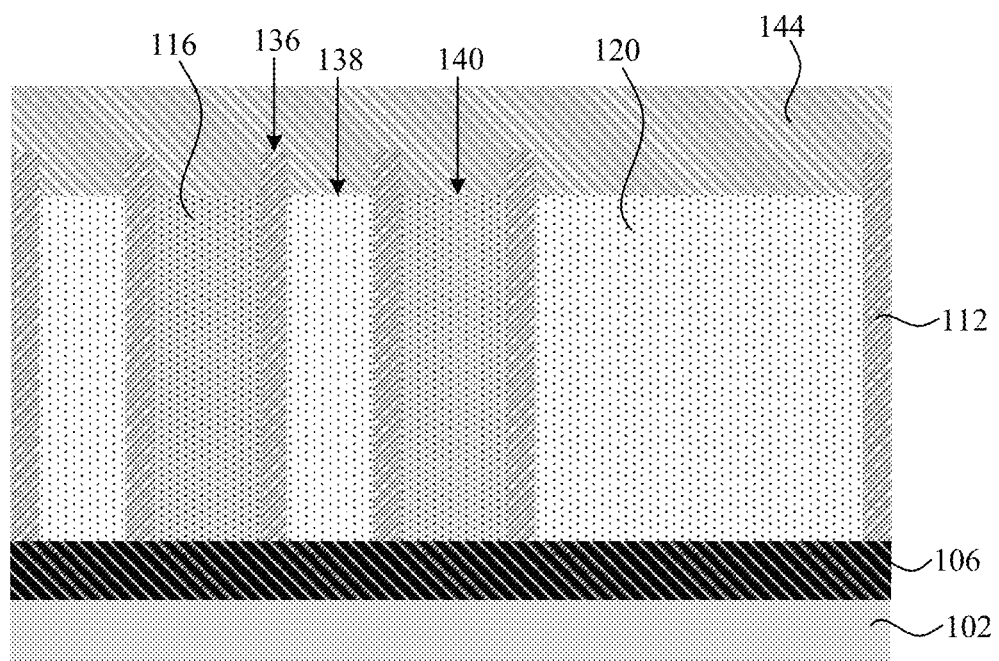

Referring to FIG. 9B (FIG. 9B continues from the embodiment shown in FIG. 8B), the dielectric fill layer 144 is also deposited on the gate isolation structures 120, the dielectric isolation structures 116 and the gate spacers 112. In particular, the dielectric fill layer 144 covers the top surfaces 136 of the gate spacers 112 extending above the top surfaces 138 of the gate isolation structures 120 and the top surfaces 140 of the dielectric isolation structures 116.

Figure 9C:
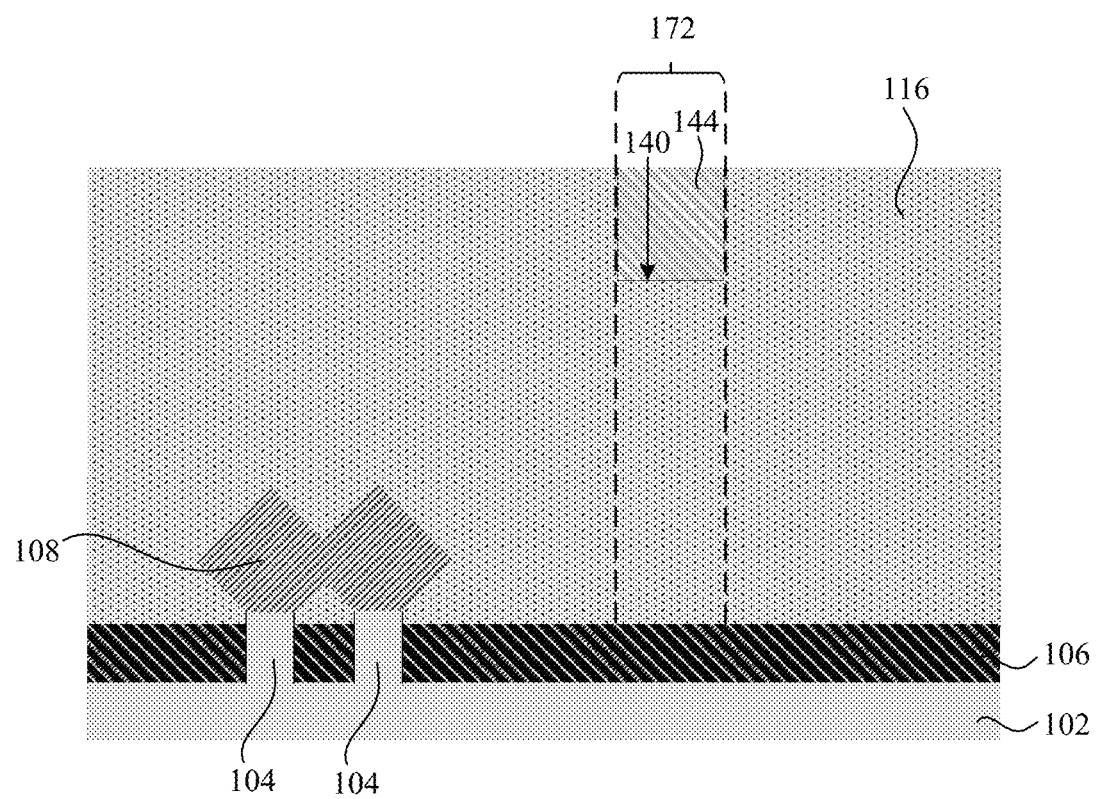

Referring to FIG. 9C (FIG. 9C continues from the embodiment shown in FIG. 8C), the deposition of the dielectric fill layer 144 fills the recess opening in the portion of the dielectric isolation structures 116 within the gate cut region 172.

Figure 10A:
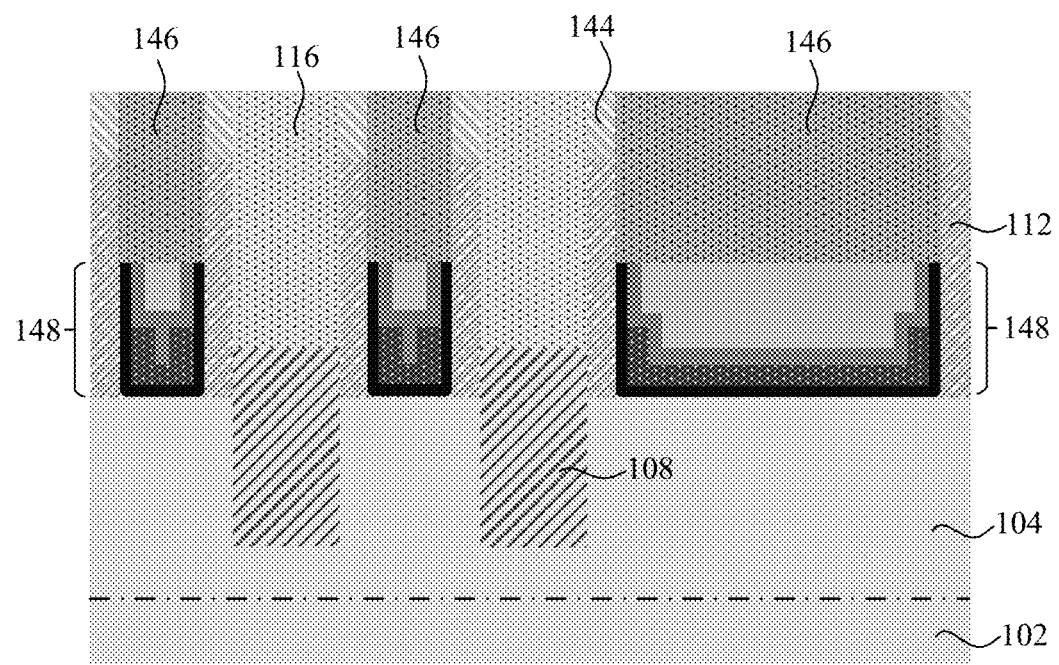
FIGS. 10A and 10B are cross-sectional views of the device structure after formation of a gate cap dielectric layer, in accordance with embodiments of the present disclosure.
Figure 10B:
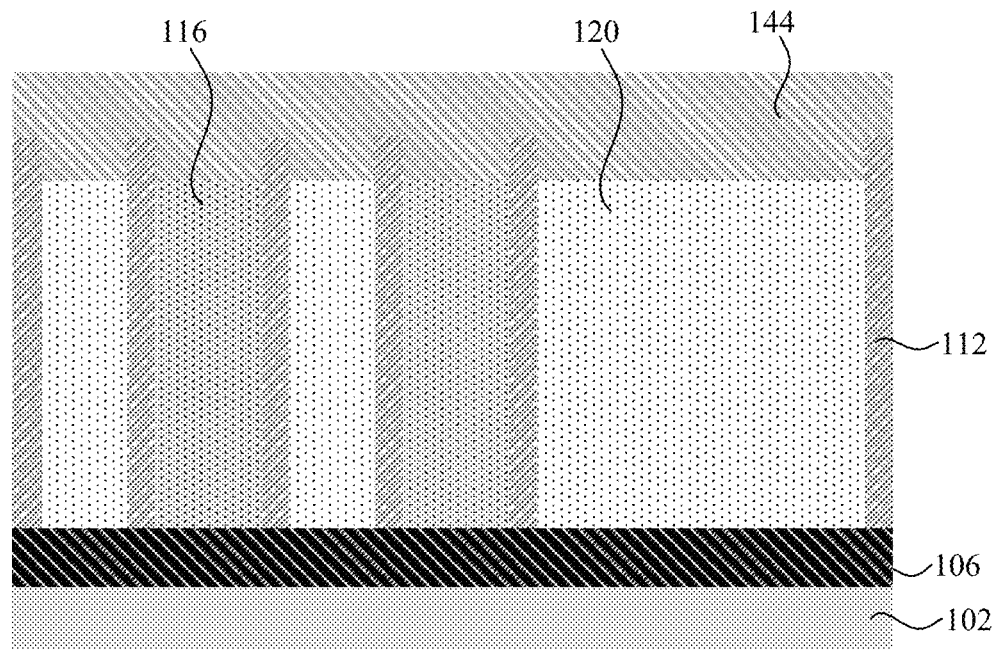

Referring to FIGS. 10A and 10B (FIG. 10A continues from the embodiment shown in FIG. 9A, and FIG. 10B continues from the embodiment shown in FIG. 9B), a gate cap dielectric layer 146 is formed on each one of the gate stacks 148. The view in FIG. 10B is identical to the view in FIG. 9B.

To form the gate cap dielectric layer 146, each gate stack 148 is recessed using conventional semiconductor techniques employed in RMG processes. For example, dry etch processes are used to recess the gate stack. A nitride-containing dielectric compound, such as silicon nitride, may be deposited on the recessed gate stacks 148 using conventional deposition techniques, such as CVD. Additional planarization may be performed on the deposited gate cap dielectric layer 146.

Figure 11A:
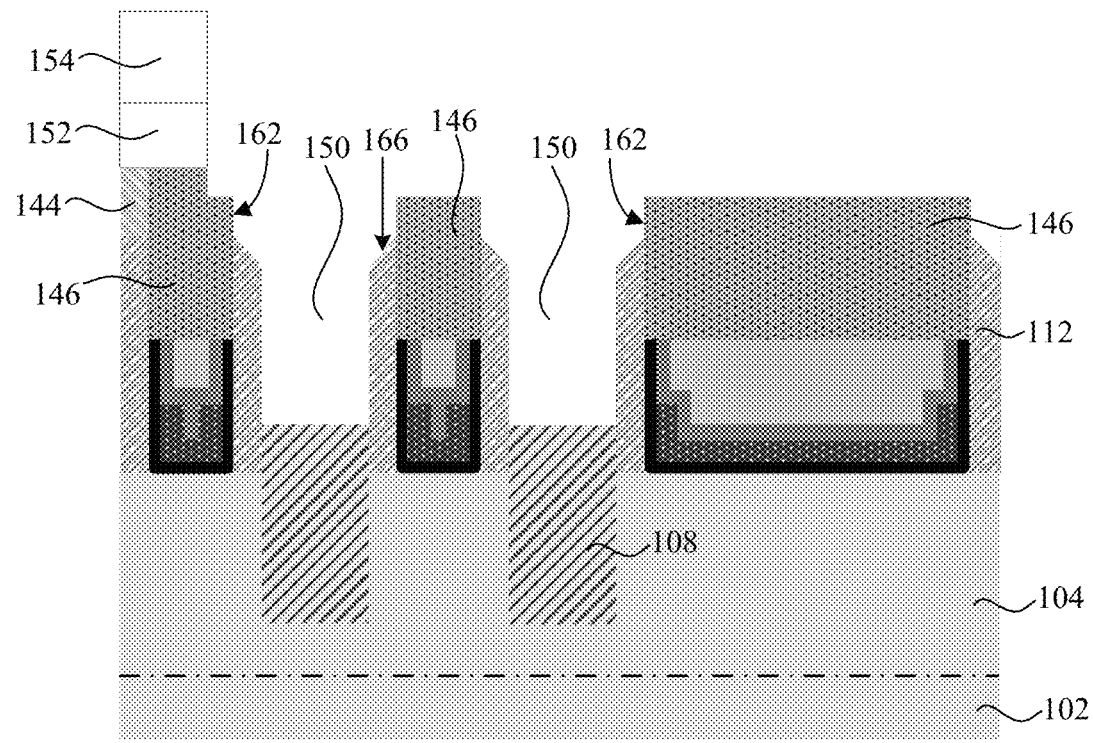
FIGS. 11A, 11B, and 11C are cross-sectional views of the device structure after formation of a trench contact cavity, in accordance with embodiments of the present disclosure.
Figure 11B:
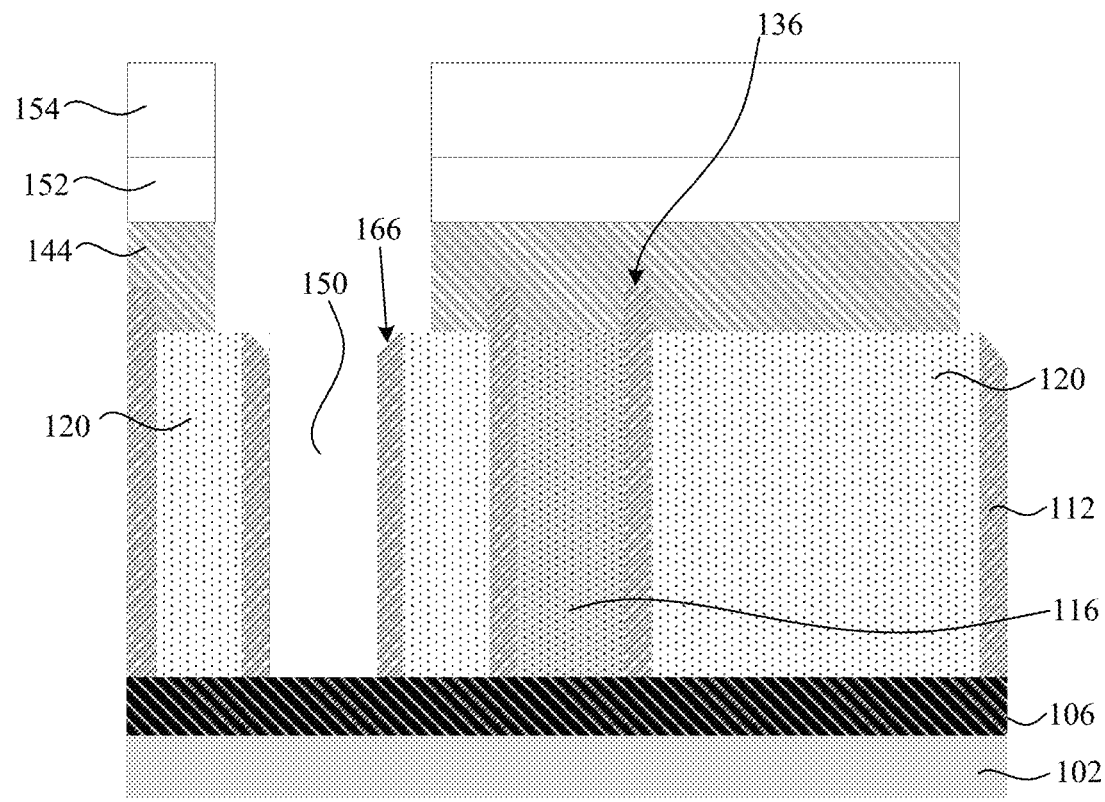

Referring to FIGS. 11A and 11B (FIG. 11A continues from the embodiment shown in FIG. 10A, and FIG. 11B continues from the embodiment shown in FIG. 10B), trench contact cavities 150 are formed in the dielectric isolation structures 116. A first interlayer dielectric structure 152 may be deposited on the device structure, followed by depositing a mask layer 154 on the first interlayer dielectric structure 152. The mask layer 154 is then patterned using photolithographic techniques with the use of a mask. Thereafter, the trench contact cavities 150 are formed by selectively removing the first dielectric structure 152, the dielectric isolation structures 116 and the dielectric fill layer 144. An ashing process (e.g. plasma ashing) may be subsequently performed to remove the remaining mask layer 154, followed by a planarization process (e.g., CMP) to remove the remaining first dielectric structure 152.

The mask layer 154 may be patterned with openings (not shown) over selected dielectric isolation structures 116 for forming the trench contact cavities 150. For example, in the embodiment of FIG. 11B, the mask layer 154 is patterned such that one of the dielectric isolation structures 116 is selectively removed to form a trench contact cavity 150 while the other is retained. Alternatively, in another embodiment (not shown), all of the dielectric isolation structures 116 within the gate cut region are removed.

The removal of one of the dielectric isolation structures 116 includes anisotropic etching of the first interlayer dielectric structure 152 and the dielectric fill layer 144, simultaneously forming tapered top surfaces 166 of the gate spacers 112 that are adjacent to the formed trench contact cavity 150.

The mask layer 154 may be an organic planarization layer (OPL) and may include any suitable photo-sensitive organic material such as polyacrylate resin, epoxy resin, phenol resin, polyamide resin, polyimide resin, unsaturated polyester resin, polyphenylenether resin, polyphenylenesulfide resin, or benzocyclobutene (BCB).

The etching process to form the trench contact cavities 150 is highly selective to the material in the dielectric isolation structures 116 and the dielectric fill layer 144. In some embodiments, the etching is a dry etch process and may be controlled by a predetermined time. In particular, the etching is performed anisotropically (e.g., in the vertical direction).

Referring to the embodiment in FIG. 11A, during the formation of the trench contact cavities 150, the vertical etch removes the dielectric fill layers 144 above the top surfaces of the gate spacers 112 while simultaneously removing the portion of the dielectric isolation structures 116 above the source or drain regions 108. After complete removal of the dielectric fill layers 144, the vertical etch continues to recess the underlying top surfaces of the gate spacers 112.

Due to the etch selectivity between the dielectric isolation structures 116 and the gate spacers 112, the etch rate of the dielectric isolation structures 116 is faster than the etch rate of the gate spacers 112. For example, the etch selectivity ratio of the dielectric isolation structures 116 to the gate spacers 112 may be in the range of 5:1 to 10:1. As a result of the vertical etching, the gate spacers 112 directly adjacent to the trench contact cavities 150 may have tapered top surfaces 166. Additionally, an upper sidewall portion 162 of the gate cap dielectric layer 146 is exposed during the vertical etching, which also forms the tapered top surfaces 166 of the gate spacers 112.

Also shown in FIG. 11A, during the formation of the trench contact cavities 150, there may be loss of material in upper portions of the gate cap dielectric layers 146. The loss of material in the gate cap dielectric layers 146 may be substantially lesser as compared to that of the gate spacers 112 due to the etch selectivity between the dielectric isolation structures 116 and the gate cap dielectric layers 146. For example, the etch selectivity ratio of the dielectric isolation structures 116 to the gate cap dielectric layers 146 may be about 20:1.

Also shown in FIG. 11B, during the formation of the trench contact cavities 150, the vertical etch may also partially reveal a top surface of the adjacent gate isolation structure 120 after the removal of the dielectric fill layer 144. The partial reveal may be due to process variations during the photolithography step. For example, the mask layer 154 is patterned to have openings that are wider than the width of the dielectric isolation structures 116 so as to provide wider margins for the vertical etch process to form the trench contact cavities 150.

Figure 11C:
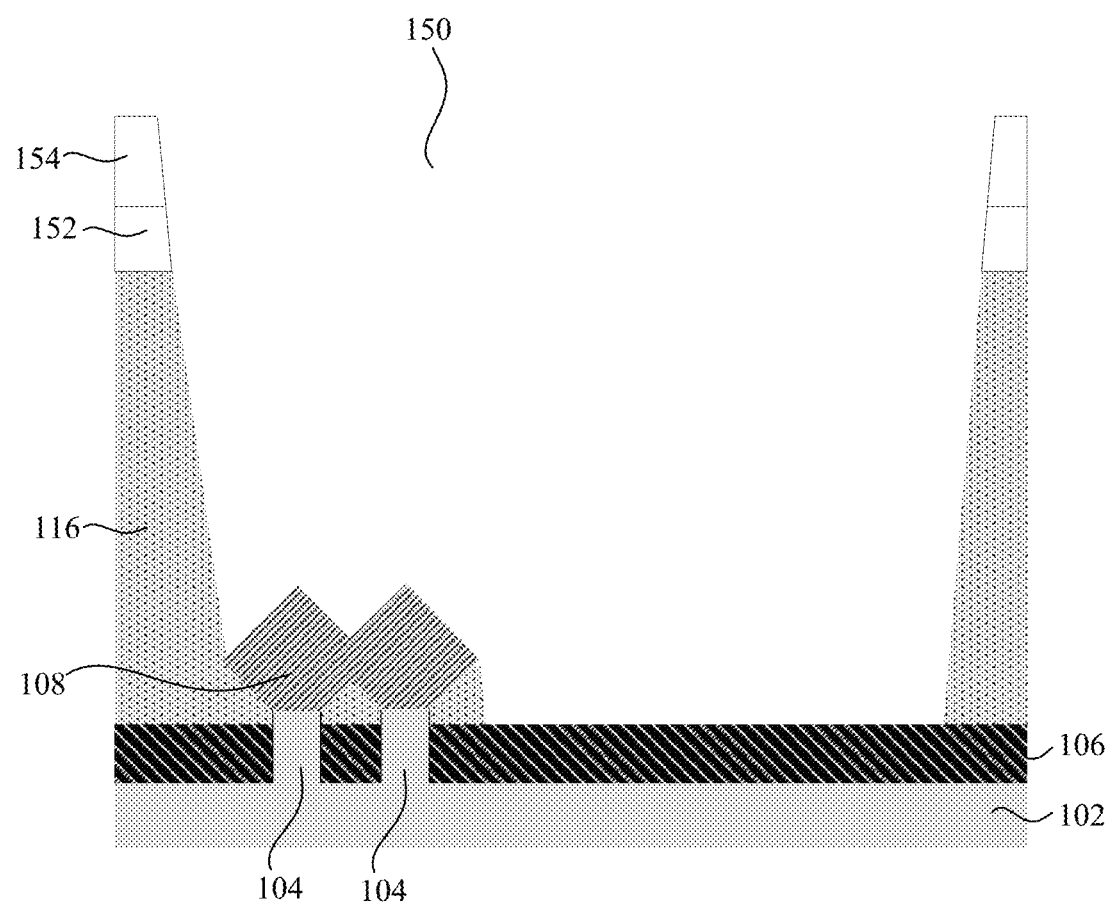

Referring to FIG. 11C (FIG. 11C continues from the embodiment shown in FIG. 10C), the trench contact cavities 150 in the dielectric isolation structure 116 exposes the insulating layer 106 and the source or drain regions 108.

Figure 12A:
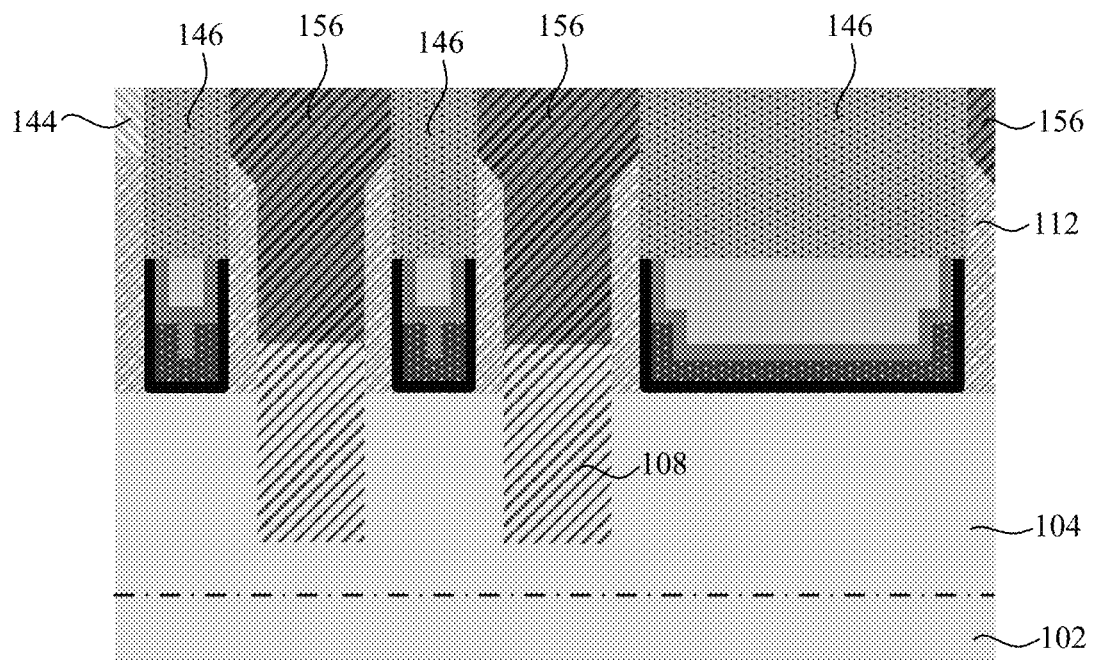
FIGS. 12A, 12B, and 12C are cross-sectional views of the device structure after formation of a trench contact structure, in accordance with embodiments of the present disclosure.
Figure 12B:
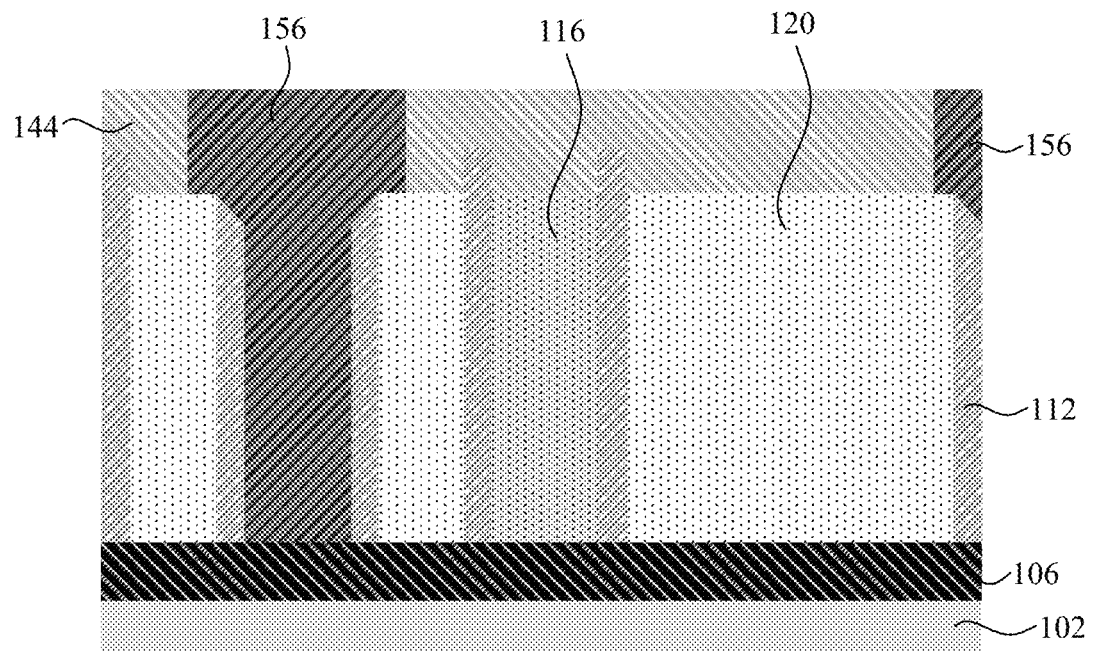

Referring to FIGS. 12A and 12B (FIG. 12A continues from the embodiment shown in FIG. 11A, and FIG. 12B continues from the embodiment shown in FIG. 11B), trench contact structures 156 are formed and fills the trench contact cavities. The trench contact structure 156 may be an electrically conductive metal, including one or more of tungsten (W), ruthenium (Ru), cobalt (Co), copper (Cu), titanium (Ti), nickel (Ni), platinum (Pt) or aluminum (Al), and may be formed using conventional deposition techniques, such as ALD, CVD or PVD.

Figure 12C:
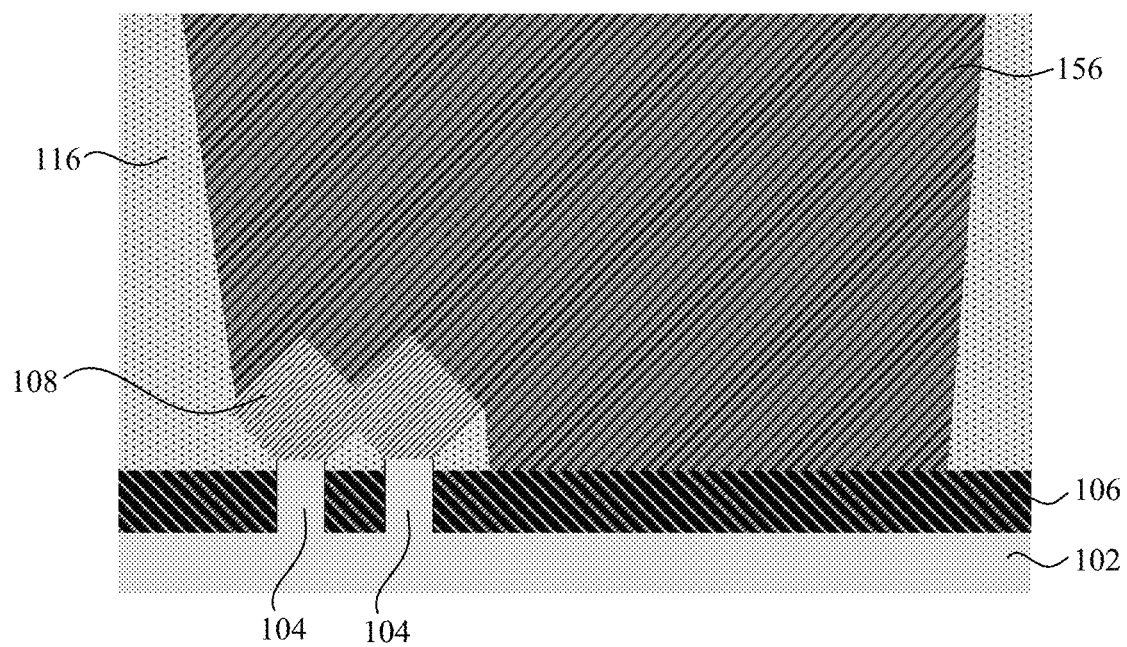

Referring to FIG. 12C (FIG. 12C continues from the embodiment shown in FIG. 11C), the trench contact structures 156 are disposed on the source or drain regions 108 and the insulating layer 106.

Figure 13A:
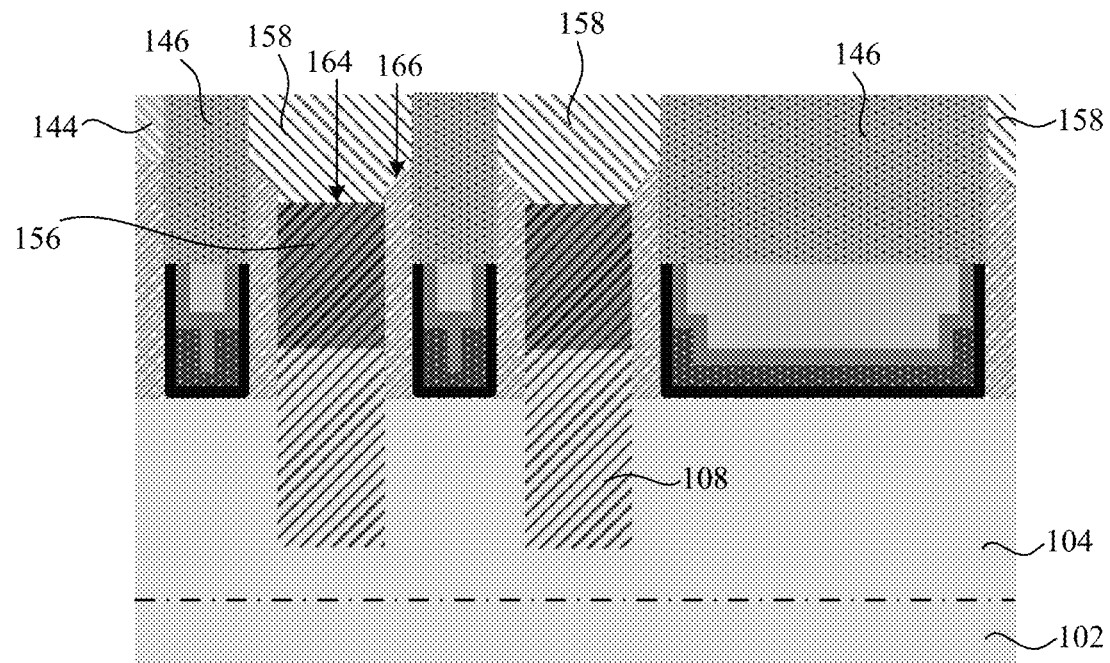
FIGS. 13A, 13B, and 13C are cross-sectional views of the device structure after formation of a trench cap dielectric layer, in accordance with embodiments of the present disclosure.
Figure 13B:
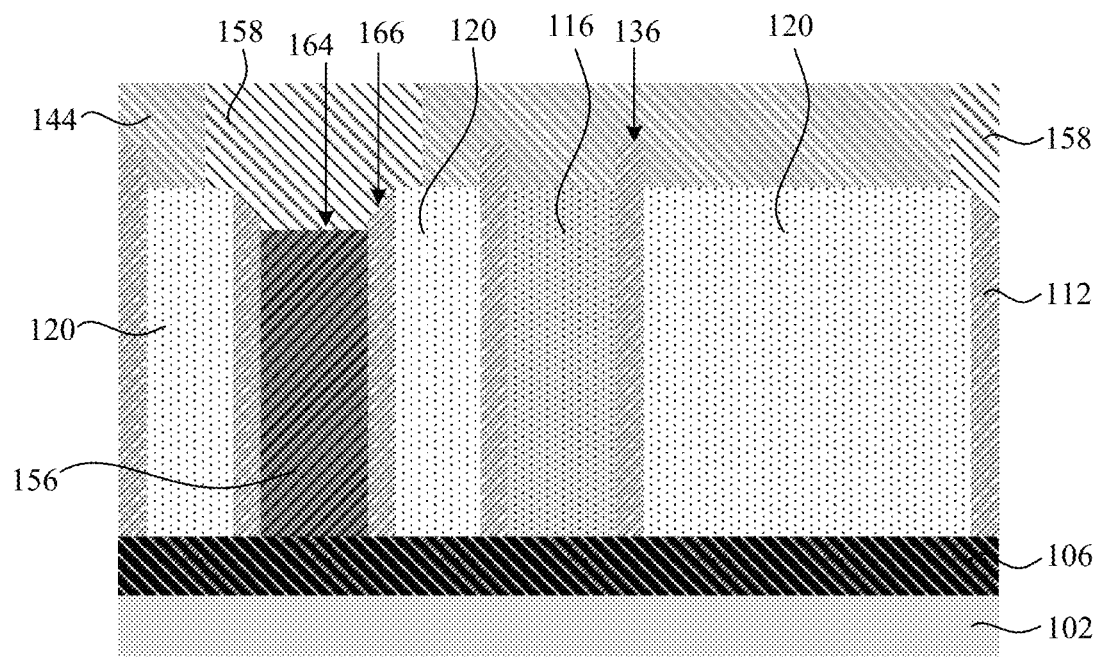
Figure 13C:
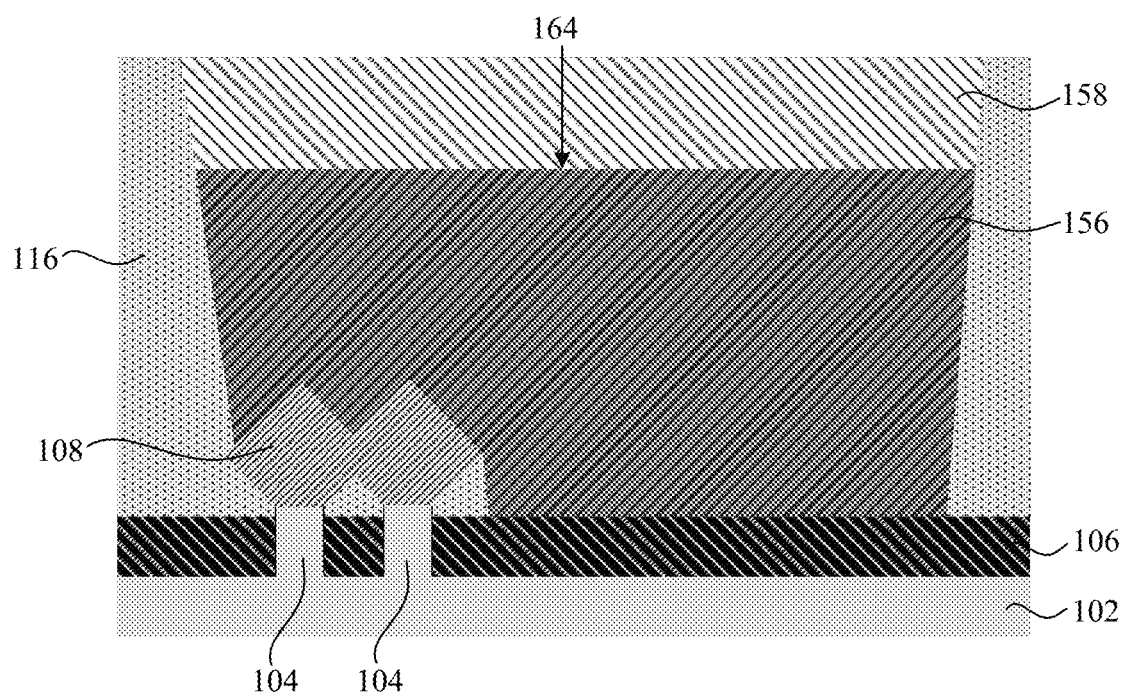

Referring to FIGS. 13A, 13B, and 13C (FIG. 13A continues from the embodiment shown in FIG. 12A, FIG. 13B continues from the embodiment shown in FIG. 12B, and FIG. 13C continues from the embodiment shown in FIG. 12C), a trench cap dielectric layer 158 is formed on each one of the trench contact structures 156.

To form the trench cap dielectric layer 158, each trench contact structure 156 may be recessed by an etch process (e.g., a dry etch or a wet etch) that selectively removes the material of the trench contact structure 156. The trench contact structure 156 may be recessed to have a top surface 164 that is below the tapered top surfaces 166 of the gate spacers 112. The trench cap dielectric layer 158 is then formed on the top surfaces 164 of each of the recessed trench contact structure 156 as well as the tapered top surfaces 166 of the gate spacers 112.

The trench cap dielectric layer 158 may include a carbon-containing dielectric compound, such as silicon carbide, and may be deposited using conventional deposition techniques, such as CVD. Additional planarization may be performed on the deposited trench cap dielectric layer 158.

In the embodiment shown in FIG. 13A, the trench cap dielectric layer 158 is directly adjacent to and coplanar with the gate cap dielectric layer 158. In the embodiment shown in FIG. 13B, the trench cap dielectric layer 158 is directly adjacent to and coplanar with the dielectric fill layer 144.

The gate cap dielectric layer 146 may be made of a material having a different etch characteristic than the trench cap dielectric layer 158. As will be seen in subsequent processing operations, such a difference may be exploited to etch the gate cap dielectric layer 146 selectively from the trench cap dielectric layer 158, and vice versa.

FIG. 14A (i) is an exemplary cross-sectional view illustrating the formation of a gate contact via 168 above a first gate stack 148a. Continuing from the embodiment shown in FIG. 13A, the gate contact via 168 may be formed by depositing a second interlayer dielectric structure 160 above the device structure, and patterning the second interlayer dielectric structure 160 using conventional masking and patterning techniques.

The second interlayer dielectric structure 160 may be patterned with openings (not shown) over the first gate stack 148a. Subsequently, the gate cap dielectric layer 146 above the first gate stack 148a is selectively removed using etching to form a gate contact via opening (not shown for illustrative convenience), while the gate cap dielectric layers 146 on the second gate stacks 148b are retained. An electrically conductive material (e.g., copper, cobalt, aluminum, titanium, etc.) is deposited in the gate contact via opening to form the gate contact via 168.

The etch selectivity between the material in the gate cap dielectric layer 146 and the material in the trench cap dielectric layer 158 may be engineered such that there is minimal loss of material in the trench cap dielectric layer 158 during the formation of a gate contact via opening.

As illustrated in FIG. 14A (i), the trench cap dielectric layer 158 covers the tapered top surfaces 166 of the gate spacers 112 and the top surfaces of the trench contact structures 156. The gate cap dielectric layer 146 is disposed on the first gate stack 148a when the gate contact via 168 is disposed on the second gate stacks 148b. Additionally, the trench cap dielectric layer 158 is directly adjacent to the gate cap dielectric layer 146, and there are no gate spacer materials in between the trench cap dielectric layer 158 and the gate cap dielectric layer 146.

Advantageously, the present method and structure are found to increase the process margin for forming the gate contact via opening, for example, by etching a wider gate contact via opening. In conventional semiconductor fabrication, however, the process margin for the etching process may be strictly controlled (e.g., forming a relatively narrow gate contact via opening) in order to avoid unwanted loss of material (e.g., by partial or complete erosion) and maintain the thickness of the gate spacer during the etching process, which may otherwise result in an electrical short between the gate stacks 148 and the gate contact via 168.

More advantageously, by having the trench cap dielectric layer 158 covering the top surface of the gate spacers 112, it is found that the trench cap dielectric layer 158 blocks vertical etch of the gate spacers 112 during the etching process to form the gate contact via 168.

FIG. 14A (ii) is another exemplary cross-sectional view illustrating the formation of a trench contact via 170 above a first trench contact structure 156a. Continuing from the embodiment shown in FIG. 13A, the trench contact via 170 may be formed by depositing a second interlayer dielectric structure 160 above the device structure, and patterning the second interlayer dielectric structure 160 using conventional masking and patterning techniques.

The second interlayer dielectric structure 160 may be patterned with openings (not shown) over the first trench contact structure 156a. Subsequently, the trench cap dielectric layer 158 above the first trench contact structure 156a is selectively removed to form a trench contact via opening (not shown for illustrative convenience), followed by depositing an electrically conductive material (e.g., copper, cobalt, aluminum, titanium, etc.) in the trench contact via opening. The trench cap dielectric layer 158 on the second trench contact structure 156b is retained.

The etch selectivity between the material in the trench cap dielectric layer 158 and the material in the gate cap dielectric layer 146 may be engineered such that there is minimal loss of material in the gate cap dielectric layer 146 during the formation of a gate contact via opening.

As illustrated in FIG. 14A (ii), the trench cap dielectric layer 158 is disposed on the first trench contact structure 156a when the trench contact via 170 is disposed on the second trench contact structure 156b. Additionally, the trench contact via 170 is also disposed on the tapered top surfaces 166 of the gate spacers 112.

As illustrated in FIGS. 14A (i) and 14A (ii), the gate stacks 148a and 148b have top surfaces 174 that are at a level below the tapered top surfaces 166 of the gate spacers 112 and the top surfaces of the trench contact structures 156a and 156b.

Advantageously, by recessing the gate stacks 148a and 148b below the gate spacers 112 and the trench contact structures 156a and 156b, the gate cap dielectric layer 146 above the gate stacks 148a and 148b have sufficient height h1 to prevent any electrical short between the trench contact via 170 (e.g., corners of the structure) and the gate stacks 148a and 148b.

More advantageously, by stopping the planarization process with the planarization stop liner (as shown in FIGS. 6A-6C), it is found that a larger height h1 of the gate cap dielectric layer 146 can be formed on the gate stacks 148a and 148b, which prevents any electrical short between trench contact via 170 and the adjacent gate stacks 148a and 148b.

Figure 14B:
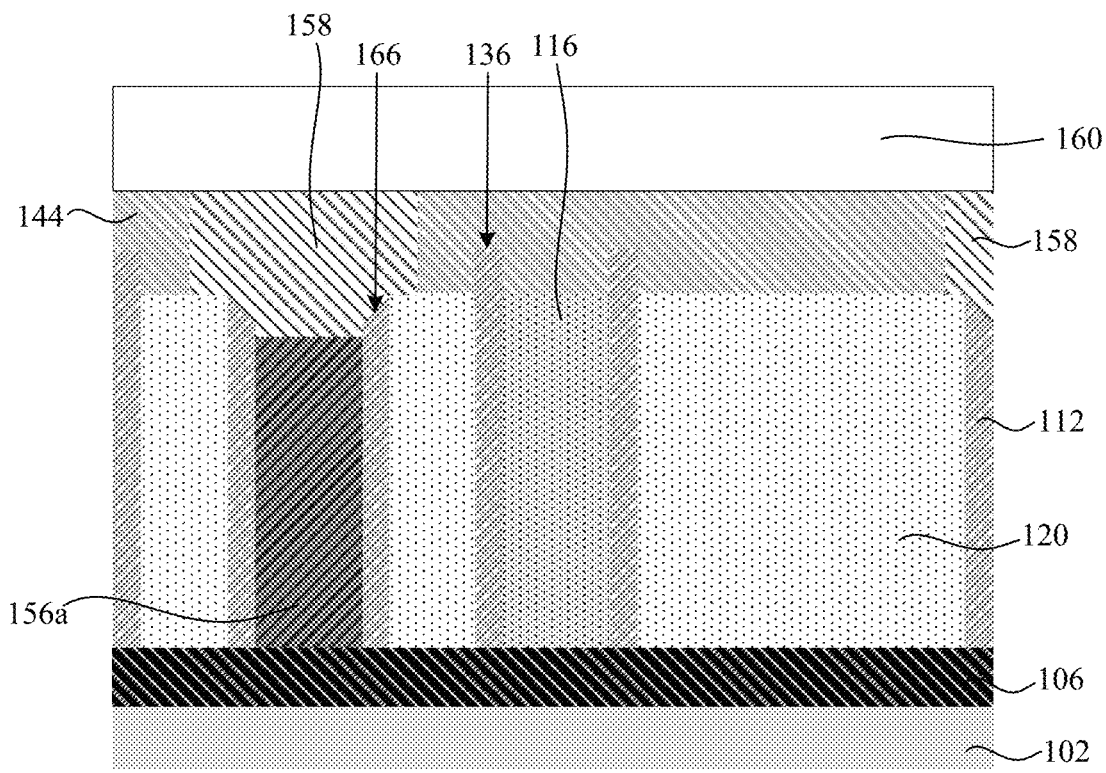
FIGS. 14A(i), 14A(ii), 14B, and 14C are cross-sectional views of the device structure after formation of a trench contact via and/or a gate contact via, in accordance with embodiments of the present disclosure.

FIG. 14B continues from the embodiment shown in FIG. 13B and depicts an exemplary cross-sectional view along the gate cut region of the semiconductor device after formation of the gate contact via 168 and/or the trench contact via 170, in accordance with embodiments of the present disclosure.

As shown in FIG. 14B, the first trench contact structure 156a is disposed in between the gate isolation structures 120. A dielectric isolation structure 116 is retained after the formation of the trench contact cavities, as described in FIGS. 11A-11C, and the gate spacers 112 directly adjacent to the retained dielectric isolation structure 116 have top surfaces 136 extending above the top surfaces 138 of the gate isolation structures 120.

Figure 14C:
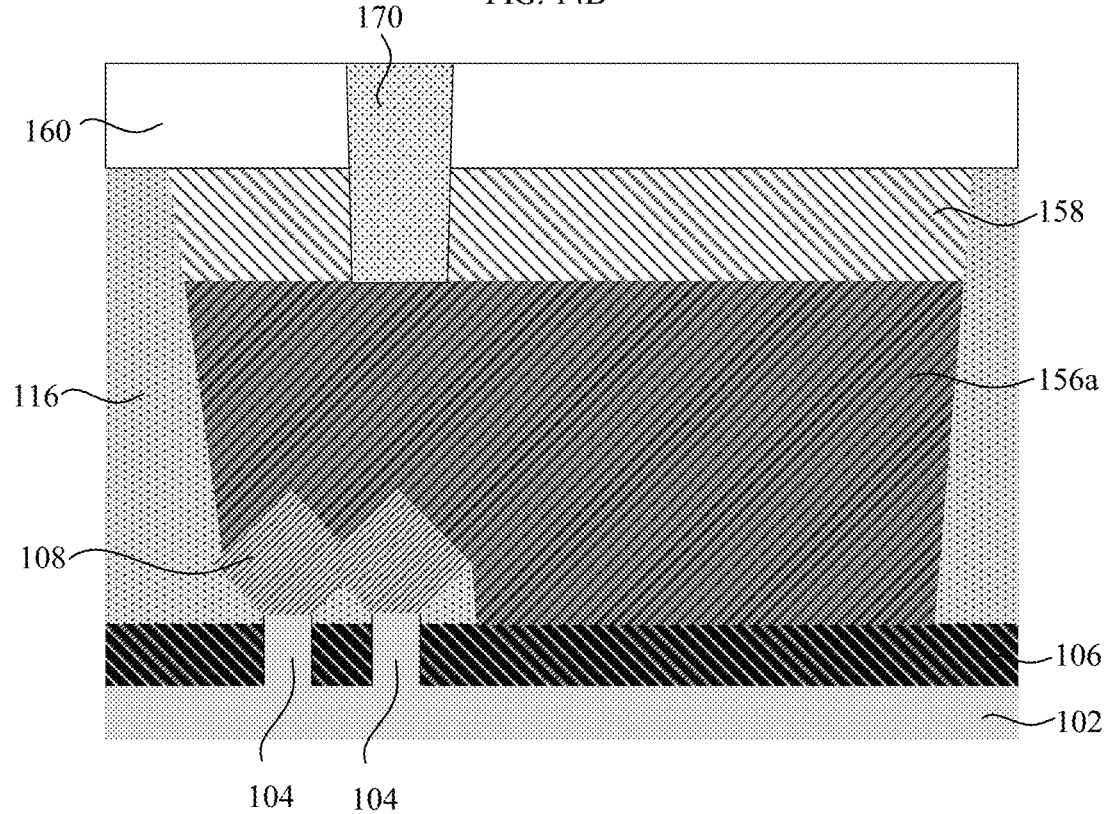

FIG. 14C continues from the embodiment shown in FIG. 13C and illustrates the exemplary cross-sectional view of the structure after formation of the trench contact via 170, in accordance with embodiments of the present disclosure. As shown in FIG. 14C, the trench contact via 170 is formed on the first trench contact structure 156a and located above the active region 104.

Although not illustrated in the accompanying drawings, the gate contact via 168 and the trench contact via 170 may be placed on at least one selected gate stack 148 and/or at least one trench contact structure 156, respectively. Selection of gate stacks 148 and trench contact structures 156 for the placement of the gate contact via 168 and the trench contact via 170, respectively, may depend on the design requirements of the device (e.g., circuitry design, routing of electrical signals across device components, spatial and layout constraints, etc.).

For example, the gate contact via 168 may be placed on at least one gate stack selected from the plurality of gate stacks in a device, while the gate cap dielectric layers 146 may be placed on unselected gate stacks, according to the design requirements.

In another example, the trench contact via 170 may be placed on at least one trench contact structure selected from the plurality of trench contact structures in a device, while the trench cap dielectric layers 158 may be placed on unselected trench contact structures, according to the design requirements.

The gate contact via 168 and the trench contact via 170 may function as electrical interconnections between the "front end of line" components and "back end of line" components in a semiconductor device. Although not illustrated in the accompanying drawings, it is within the scope of the present disclosure to have the gate contact via 168 and the trench contact via 170 formed above the same active region or formed on different active regions, depending on the design requirements of the device.

In an example, the gate contact via 168 is formed on a gate stack 148 above an active region 104, such as a fin. The trench contact via 170 is formed on a trench contact structure 156 that is adjacent to the gate stack 148 and also above the same fin.

In another example, the gate contact via 168 is formed on a gate stack 148 above a first fin. The trench contact via 170 is formed on a trench contact structure 156 above a second fin that is adjacent to the first fin.

In embodiments of the present disclosure, the gate cap dielectric layer 146 functions as an insulating layer to prevent electrical short between the gate stack 148 and the trench contact via 170, while the trench cap dielectric layer 158 functions as an insulating layer to prevent electrical short between the trench contact structure 156 and the gate contact via 168.

Throughout this disclosure, the terms top, upper, upwards, over, and above refer to the direction away from the active region. Likewise, the terms bottom, lower, downwards, under, and below refer to the direction towards the active region. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description.

Additionally, the various tasks and processes described herein may be incorporated into a more comprehensive procedure or process having additional functionality not described in detail herein. In particular, various processes in the manufacture of integrated circuits are well-known and so, in the interest of brevity, many conventional processes are only mentioned briefly herein or omitted entirely without providing the well-known process details.

As will be readily apparent to those skilled in the art upon a complete reading of the present application, the methods of forming the semiconductor structure disclosed herein may be employed in manufacturing a variety of different integrated circuit products, including, but not limited to, logic products, memory products, 3D transistor devices, FinFET transistor devices, planar transistor devices, CMOS devices, SOI devices etc.

What is claimed is:

1. A semiconductor device comprising:
   an active region and a shallow trench isolation layer disposed above a substrate;
   a plurality of source or drain regions disposed in the active region;
   a plurality of gate stacks having a first and second gate stacks, wherein each gate stack is disposed in between the source or drain regions;
   a plurality of trench contact structures having a first and second trench contact structures, wherein each trench contact structure is disposed on a corresponding source or drain region;
   gate spacers with top surfaces, wherein the gate spacers are adjacent to the trench contact structures;
   a gate cut region having a plurality of gate isolation structures disposed on the shallow trench isolation layer, wherein the first trench contact structure is also disposed on the shallow trench isolation and in between the gate isolation structures;
   a gate cap dielectric layer disposed on the first or the second gate stack;
   a trench cap dielectric layer disposed on a top surface of the first or the second trench contact structure and the top surfaces of the gate spacers, wherein the trench cap dielectric layer has a top surface that is coplanar with a top surface of the gate cap dielectric layer; and
   a dielectric fill layer disposed on the gate isolation structures and adjacent to the trench cap dielectric layer.

2. The device of claim 1, wherein the dielectric fill layer is coplanar with and directly adjacent to the trench cap dielectric layer.

3. The device of claim 1, further comprising the gate stacks having top surfaces that are at a level below the top surfaces of the trench contact structures.

4. The device of claim 1, wherein the trench cap dielectric layer is disposed on tapered top surfaces of the gate spacers.

5. The device of claim 1, further comprising a gate contact via disposed on the second gate stack when the gate cap dielectric layer is disposed on the first gate stack.

6. The device of claim 1, further comprising a trench contact via disposed on the second trench contact structure when the trench cap dielectric layer is disposed on the first trench contact structure, wherein the trench contact via is also disposed on the top surfaces of the gate spacers.

7. The device of claim 1, wherein the gate cut region further comprises a dielectric isolation structure disposed on the shallow trench isolation layer and in between the gate isolation structures.

8. The device of claim 7, wherein the gate cut region further comprises gate spacers that are also directly adjacent to the dielectric isolation structure and have top surfaces extending above top surfaces of the gate isolation structures.

9. A method of forming structures in a semiconductor device comprising:
providing on a substrate, active regions having a plurality of source or drain regions formed therein and isolation regions having a plurality of dielectric isolation structures with adjacent gate spacers and a gate cut region having a plurality of gate isolation structures and a plurality of gate isolation material layers, wherein the dielectric isolation structures have a portion formed on the plurality of source or drain regions and a portion formed in between the gate isolation structures with the gate isolation material layer from the gate cut region thereabove;
forming gate cavities between the source or drain regions;
forming gate stacks in the gate cavities;
forming spacer cavities by recessing top surfaces of the gate spacers;
forming a dielectric fill layer to fill the spacer cavities;
forming trench contact cavities by selectively removing the dielectric fill layer and the dielectric isolation structures; and
forming trench contact structures in the trench contact cavities.

10. The method of claim 9, further comprising forming a gate cap dielectric layer on the gate stacks before forming the trench contact cavities.

11. The method of claim 10, further comprising forming a trench cap dielectric layer on the trench contact structures and the top surfaces of the gate spacers, wherein the trench cap dielectric layer is being formed adjacent to the gate cap dielectric layer.

12. The method of claim 9, wherein forming the spacer cavities simultaneously removes the gate isolation material layer above the portion of the dielectric isolation structures within the gate cut region and recesses the gate isolation structures.

13. The method of claim 11, further comprising forming a gate contact via on a gate stack by selectively removing the gate cap dielectric layer therefrom.

14. The method of claim 11, further comprising forming a trench contact via on a trench contact structure by selectively removing the trench cap dielectric layer therefrom.

15. The method of claim 12, wherein forming the dielectric fill layer further comprises depositing the dielectric fill layer on the recessed gate isolation structures and on the portion of the dielectric isolation structures within the gate cut region.

16. The method of claim 9, wherein forming the gate stacks further comprises forming a gate dielectric layer, a planarization stop liner, and a gate electrode in each of the gate cavities.

17. The method of claim 16, wherein forming the gate electrode further comprises depositing a gate electrode material layer in each of the gate cavities and performing a planarization process to recess the gate electrode material layer to form the gate electrode.

18. The method of claim 17, wherein the planarization process is stopped by the planarization stop liner.

19. The method of claim 18, wherein forming the gate stack further comprises selectively removing portions of the gate dielectric layer and the planarization stop liner to expose the top surfaces of the gate spacers and the dielectric isolation structures before forming the spacer cavities.

* * * * *